United States Patent
Sonehara et al.

(10) Patent No.: US 10,121,796 B2
(45) Date of Patent: Nov. 6, 2018

(54) SEMICONDUCTOR MEMORY DEVICE

(71) Applicant: Toshiba Memory Corporation, Minato-ku (JP)

(72) Inventors: Takeshi Sonehara, Yokkaichi (JP); Masaru Kito, Kuwana (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 63 days.

(21) Appl. No.: 15/264,984

(22) Filed: Sep. 14, 2016

(65) Prior Publication Data

US 2017/0278861 A1    Sep. 28, 2017

Related U.S. Application Data

(60) Provisional application No. 62/312,229, filed on Mar. 23, 2016.

(51) Int. Cl.
| | |
|---|---|
| H01L 27/115 | (2017.01) |
| H01L 27/11582 | (2017.01) |
| H01L 27/11565 | (2017.01) |
| H01L 27/1157 | (2017.01) |
| H01L 27/11575 | (2017.01) |

(52) U.S. Cl.
CPC .... H01L 27/11582 (2013.01); H01L 27/1157 (2013.01); H01L 27/11565 (2013.01); H01L 27/11575 (2013.01)

(58) Field of Classification Search
CPC .................. H01L 27/11582; H01L 27/11568
See application file for complete search history.

(56) References Cited

U.S. PATENT DOCUMENTS

| | | | |
|---|---|---|---|
| 5,723,382 A * | 3/1998 | Sandhu | ................ C23C 16/34 257/E21.168 |
| 7,927,967 B2 | 4/2011 | Nomura et al. | |
| 8,013,383 B2 | 9/2011 | Kidoh et al. | |

(Continued)

FOREIGN PATENT DOCUMENTS

| | | |
|---|---|---|
| JP | 2009-200443 | 9/2009 |
| JP | 2010-135672 | 6/2010 |

(Continued)

*Primary Examiner* — Andres Munoz
(74) *Attorney, Agent, or Firm* — Oblon, McClelland, Maier & Neustadt, L.L.P.

(57) ABSTRACT

According to embodiments, a semiconductor memory device includes a plurality of control gate electrodes laminated on a substrate. A first semiconductor layer has one end connected to the substrate, has a longitudinal direction in a direction intersecting with the substrate, and is opposed to the plurality of control gate electrodes. An electric charge accumulating layer is positioned between this control gate electrode and the first semiconductor layer. A first contact has one end connected to the substrate and another end connected to a source line. A second contact has one end connected to the substrate and another end connected to a wiring other than the source line. The first contact includes a first silicide layer arranged on the substrate. The second contact includes a second silicide layer arranged on the substrate. The first silicide layer has a higher temperature resistance than the second silicide layer.

9 Claims, 34 Drawing Sheets

(56) References Cited

U.S. PATENT DOCUMENTS

| | | | |
|---|---|---|---|
| 8,163,617 B2* | 4/2012 | Ahn | H01L 21/28273 257/E21.41 |
| 8,188,530 B2 | 5/2012 | Tanaka et al. | |
| 8,546,779 B2 | 10/2013 | Sonehara | |
| 2011/0002178 A1* | 1/2011 | Hwang | H01L 27/11578 365/189.011 |
| 2013/0089974 A1* | 4/2013 | Lee | H01L 27/11556 438/510 |
| 2013/0207193 A1* | 8/2013 | Haneda | H01L 27/088 257/365 |
| 2014/0054672 A1* | 2/2014 | Kim | H01L 29/792 257/324 |
| 2014/0054673 A1* | 2/2014 | Kim | H01L 29/792 257/324 |
| 2014/0248761 A1* | 9/2014 | Park | H01L 21/823871 438/586 |
| 2015/0221666 A1* | 8/2015 | Lee | H01L 29/66833 257/66 |
| 2015/0228663 A1* | 8/2015 | Youn | H01L 27/11582 438/268 |
| 2015/0318296 A1* | 11/2015 | Kim | H01L 27/1157 257/296 |
| 2016/0322379 A1* | 11/2016 | Oomori | H01L 27/11582 |
| 2017/0125538 A1* | 5/2017 | Sharangpani | H01L 21/28556 |

FOREIGN PATENT DOCUMENTS

| | | |
|---|---|---|
| JP | 2011-9328 | 1/2011 |
| JP | 2011-119296 | 6/2011 |

* cited by examiner

SEMICONDUCTOR MEMORY DEVICE

This application is based on and claims the benefit of priority from prior U.S. prior provisional Patent Application No. 62/312,229, filed on Mar. 23, 2016, the entire contents of which are incorporated herein by reference.

FIELD

Embodiments described herein relate generally to a semiconductor memory device.

BACKGROUND

Description of the Related Art

There has been known a flash memory that accumulates electric charges on an electric charge accumulating layer or a floating gate to store data. Such flash memory is connected by various methods such as a NAND type and a NOR type, thus constituting a semiconductor memory device. Recently, such semiconductor memory devices have been large capacity and highly integrated. To realize large capacity and high integration of the semiconductor memory device, a semiconductor memory device whose memory cells are three-dimensionally disposed (three-dimensional semiconductor memory device) has been proposed. At such three-dimensional semiconductor memory device, a large number of various wirings such as word lines and selection gate lines are laminated in a laminating direction.

DETAILED DESCRIPTION

A semiconductor memory device according to one embodiment includes a plurality of control gate electrodes laminated on a substrate. A first semiconductor layer has one end connected to the substrate, has a longitudinal direction in a direction intersecting with the substrate, and is opposed to the plurality of control gate electrodes. An electric charge accumulating layer is positioned between this control gate electrode and the first semiconductor layer. A first contact has one end connected to the substrate and another end connected to a source line. A second contact has one end connected to the substrate and another end connected to a wiring other than the source line. The first contact includes a first silicide layer arranged on the substrate. The second contact includes a second silicide layer arranged on the substrate. The first silicide layer has a higher temperature resistance than the second silicide layer.

The following describes non-volatile semiconductor memory devices according to embodiments in detail with reference to the accompanying drawings. Here, these embodiments are only examples. For example, the respective drawings of the semiconductor memory devices used in the following embodiments are schematically illustrated. The thickness, the width, the ratio, and a similar parameter of the layer are not necessarily identical to actual parameters. The following embodiments relate to a semiconductor memory device in a structure where a plurality of metal-oxide-nitride-oxide-semiconductor (MONOS) type memory cells (transistors) is laminated along a direction intersecting with a substrate surface (hereinafter, a Z direction in referred drawings). The MONOS type memory cell includes: a semiconductor film disposed in the Z direction as a channel on the substrate, and a gate electrode film disposed on the side surface of the semiconductor film via an electric charge accumulating layer. However, the memory cell may be another format, for example, a semiconductor-oxide-nitride-oxide-semiconductor (SONGS) type memory cell, a metal-aluminum oxide-nitride-oxide-semiconductor (MANOS) type memory cell, or a floating-gate type memory cell.

[First Embodiment]

(Semiconductor Memory Device)

Figure 1:
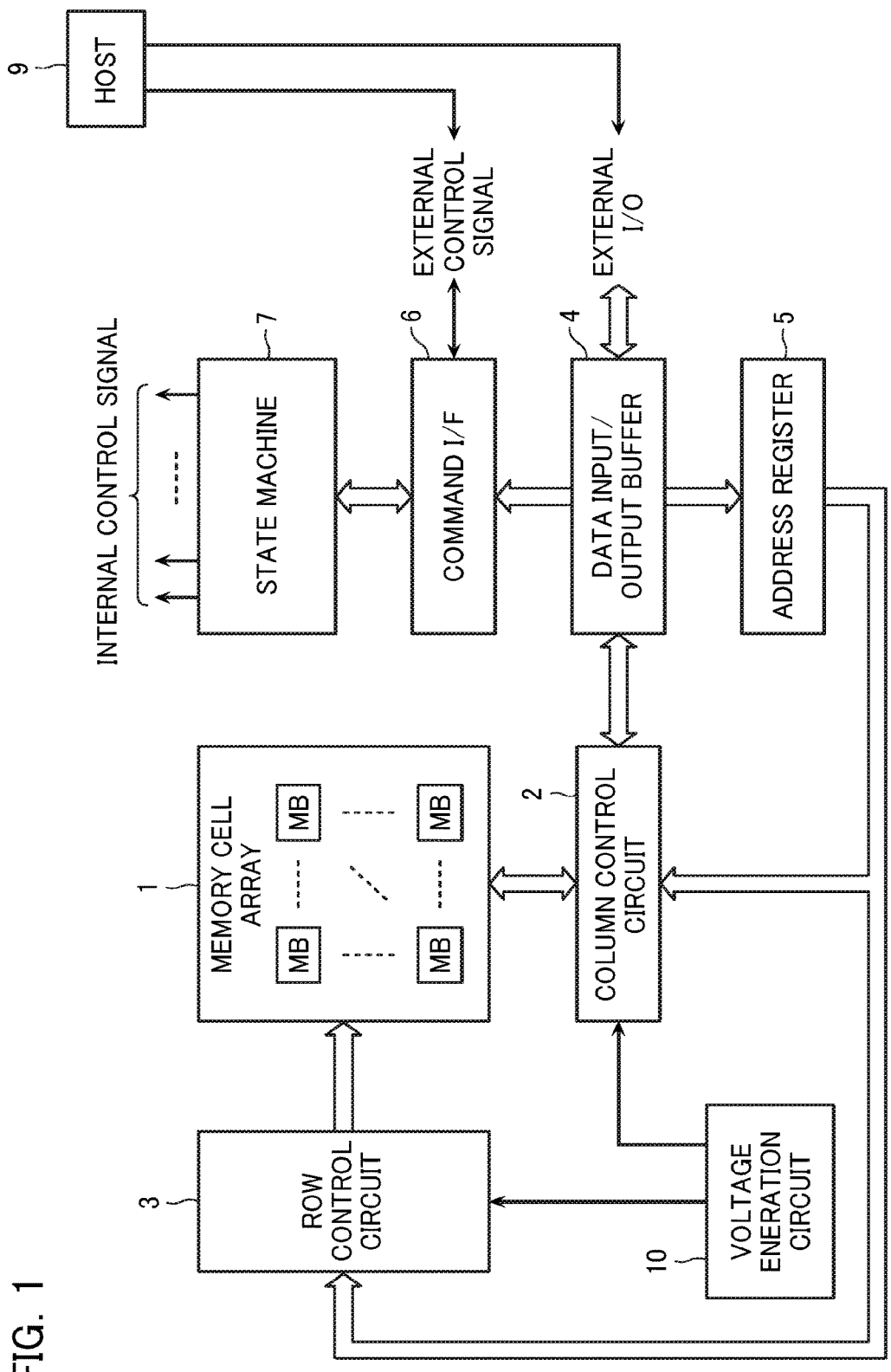
FIG. 1 is a block diagram of a non-volatile semiconductor memory device according to a first embodiment.

FIG. 1 is a block diagram of a non-volatile semiconductor memory device according to a first embodiment. The non-volatile semiconductor memory device according to the first embodiment stores writing data input from an external host 9 in a predetermined address in a memory cell array 1. The non-volatile semiconductor memory device according to the first embodiment reads data from a predetermined address in the memory cell array 1 to output to the external host 9.

That is, the non-volatile semiconductor memory device according to the first embodiment includes the memory cell array 1 that stores data. The memory cell array 1 includes a plurality of memory blocks MB. These memory blocks MB, as described later, include a plurality of memory cells, and a bit line BL and a word line WL that are connected to these memory cells.

The non-volatile semiconductor memory device according to the first embodiment includes a column control circuit 2 disposed around the memory cell array 1. The column control circuit 2 transfers voltage generated in a voltage generation circuit 10 to a desired bit line BL corresponding to input data. The column control circuit 2 includes a sense amplifier (not shown) to sense voltage or current of a predetermined bit line BL.

The non-volatile semiconductor memory device according to the first embodiment includes a row control circuit 3 disposed around the memory cell array 1. The row control circuit 3 transfers voltage generated in the voltage generation circuit 10 to a desired word line WL or similar line corresponding to input address data.

The non-volatile semiconductor memory device according to the first embodiment includes an address register 5 that supplies address data to the column control circuit 2 and the row control circuit 3. The address register 5 holds address data input from a data input/output buffer 4.

The non-volatile semiconductor memory device according to the first embodiment includes the voltage generation circuit 10 that supplies voltage to the memory cell array 1 via the column control circuit 2 and the row control circuit 3. The voltage generation circuit 10 generates and outputs predetermined magnitude of voltage at a predetermined timing corresponding to an internal control signal input from a state machine 7.

The non-volatile semiconductor memory device according to the first embodiment includes the state machine 7 that inputs the internal control signal to the voltage generation circuit 10 or similar circuit. The state machine 7 accepts command data from the host 9 via a command interface 6 to perform input and output management or similar operation of data, such as reading, writing, and erasing.

The non-volatile semiconductor memory device according to the first embodiment includes the data input/output buffer 4 connected to the external host 9 via an I/O line. The data input/output buffer 4 receives writing data from the external host 9 to transfer the data to the column control circuit 2. The data input/output buffer 4 receives command data from the external host 9 to transfer the data to the command interface 6. The data input/output buffer 4 receives address data from the external host 9 to transfer the data to the address register 5. Further, the data input/output buffer 4 receives reading data from the column control circuit 2 to transfer the data to the external host 9.

The non-volatile semiconductor memory device according to the first embodiment includes the command interface 6 that accepts an external control signal from the external host 9. The command interface 6 determines whether data input to the data input/output buffer 4 is any of writing data, command data, and address data corresponding to the external control signal input from the external host 9 to control the data input/output buffer 4. The command interface 6 transfers the command data received from the data input/output buffer 4 to the state machine 7.

The column control circuit 2, the row control circuit 3, the state machine 7, the voltage generation circuit 10, or similar circuit configure a control circuit that controls the memory cell array 1.

Figure 2:
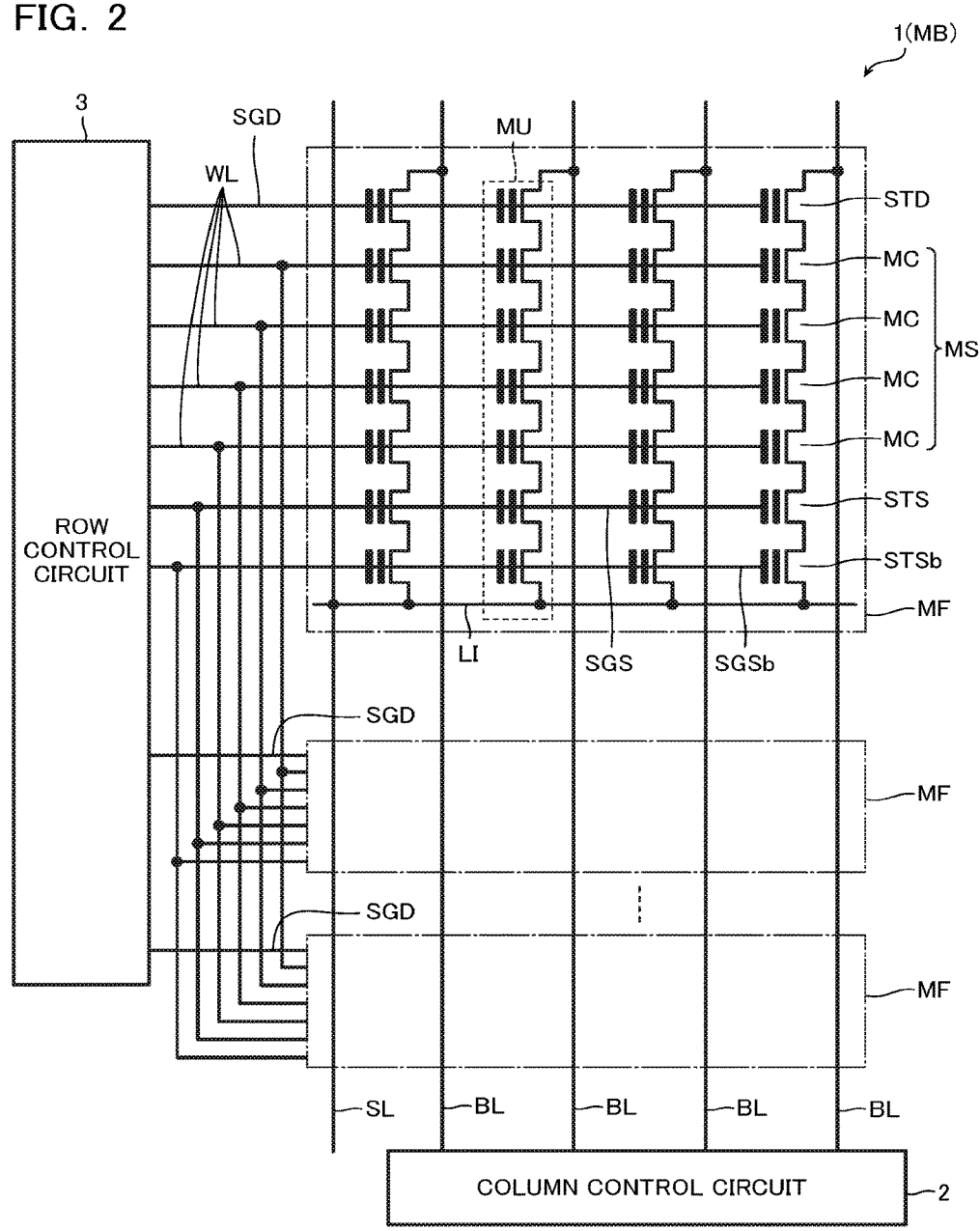
FIG. 2 is a circuit diagram that shows a part of a configuration of the non-volatile semiconductor memory device according to the first embodiment.

The following describes a part of a circuit configuration of the memory cell array 1 according to the embodiment with reference to FIG. 2. FIG. 2 is an equivalent circuit diagram that shows a configuration of the memory block MB that configures the memory cell array 1. At the memory block MB shown in FIG. 2, the row control circuit 3 selects a predetermined drain-side selection gate line SGD and a predetermined word line WL to select the predetermined numbers of memory cells MC. The column control circuit 2 reads data from these memory cells MC or write data to these memory cells MC.

As shown in FIG. 2, the memory blocks MB each include a plurality of memory fingers MF. The plurality of bit lines BL and a source line SL are commonly connected to these plurality of memory fingers MF. The respective memory fingers MF are connected to the column control circuit 2 via the bit line BL, and a source line driver (not shown) via the source line SL.

The memory finger MF includes a plurality of memory units MU. The memory unit MU has one end connected to the bit line BL and the other end connected to the source line SL via a source contact LI. The memory units MU included in one memory finger MF are all connected to different bit lines BL.

The memory unit MU includes the plurality of memory cells MC connected in series. The memory cell MC, as described below, includes a semiconductor layer, an electric charge accumulating layer, and a control gate. The memory cell MC accumulates electric charge in the electric charge accumulating layer corresponding to voltage applied to the control gate to change a threshold. Hereinafter, the plurality of memory cells MC connected in series are referred to as "a memory string MS". The row control circuit 3 transfers voltage to a predetermined word line WL to transfer this voltage to the control gate of a predetermined memory cell MC in the memory string MS.

The common word lines WL are connected to the respective control gates of the plurality of memory cells MC that configure the different memory strings MS. These plurality of memory cells MC are connected to the row control circuit 3 via the word lines WL. In an example shown in FIG. 2, the word lines WL are independently disposed by the memory cells MC included in the memory unit MU. The word lines WL are commonly disposed for all memory units MU included in one memory block MB.

The memory unit MU includes a drain-side selection gate transistor STD connected between the memory string MS and the bit line BL. The drain-side selection gate transistor STD has a control gate connected to the drain-side selection gate line SGD. The drain-side selection gate line SGD is connected to the row control circuit 3 to connect selectively the memory string MS to the bit line BL corresponding to an input signal. In the example shown in FIG. 2, the drain-side selection gate lines SGD are independently disposed by the memory fingers MF. The drain-side selection gate line SGD is commonly connected to the control gates of all drain-side selection gate transistors STD in the memory finger MF. The row control circuit 3 selects a predetermined drain-side selection gate line SGD to connect selectively all the memory strings MS in the predetermined memory finger MF to the bit lines BL.

The memory unit MU includes a source-side selection gate transistor STS and a lowermost-layer source-side selection gate transistor STSb that are connected between the memory string MS and the source contact LI. The source-side selection gate transistor STS has a control gate connected to a source-side selection gate line SGS. The lowermost-layer source-side selection gate transistor STSb has a control gate connected to a lowermost-layer source-side selection gate line SGSb. In the example shown in FIG. 2, the source-side selection gate line SGS is commonly connected to all the source-side selection gate transistors STS in the memory block MB. Similarly, the lowermost-layer source-side selection gate line SGSb is commonly connected to all the lowermost-layer source-side selection gate transistors STSb in the memory block MB. The row control circuit 3 connects all the memory strings MS in the memory block MB to the source line SL corresponding to the input signal.

Figure 3:
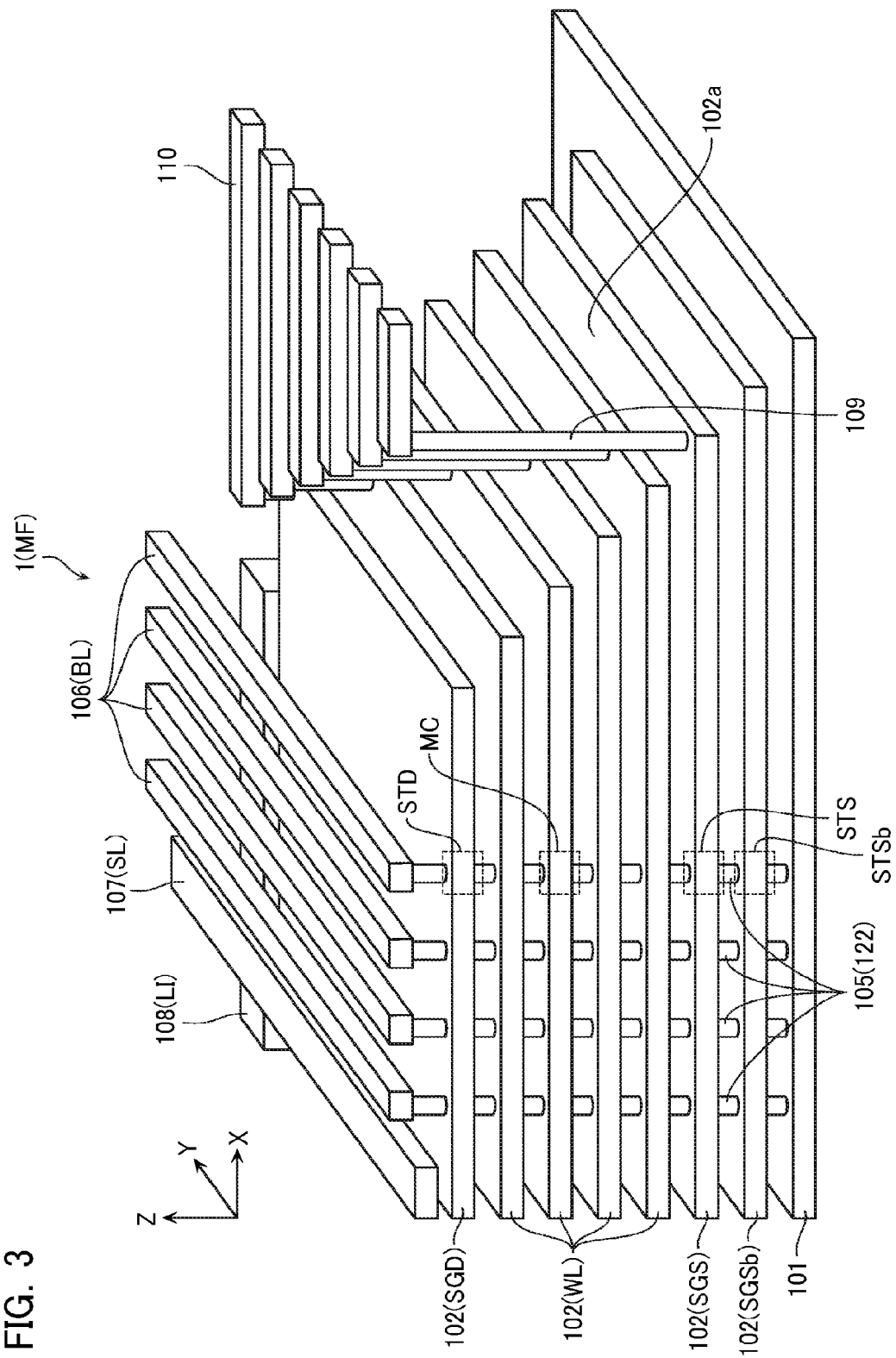
FIG. 3 is a perspective view that shows a part of the configuration of the non-volatile semiconductor memory device according to the first embodiment.

The following describes a schematic configuration of the memory cell array 1 with reference to FIG. 3. FIG. 3 is a schematic perspective view that shows a part of a configuration of the memory finger MF. FIG. 3 omits a part of the configuration. The configuration shown in FIG. 3 is merely an example. The detailed configuration or a similar configuration can be changed as necessary. For example, seven layers of conducting layers 102 are laminated in FIG. 3. However, around sixty layers of conducting layers 102 may be laminated.

The memory finger MF includes a substrate 101 and the plurality of conducting layers 102 laminated on the substrate 101 in the Z direction. The memory finger MF includes a plurality of memory shafts 105 that extend in the Z direction. The conducting layer 102 and the memory shaft 105 have an intersecting portion that functions as the lowermost-layer source-side selection gate transistor STSb, the source-side selection gate transistor STS, the memory cell MC, or the drain-side selection gate transistor STD. The conducting layer 102 is constituted of, for example, a conducting layer such as tungsten (W) or polysilicon. The respective conducting layers 102 function as the word line WL, a control gate electrode of the memory cell MC, the source-side selection gate line SGS, a control gate electrode of the source-side selection gate transistor STS, the drain-side selection gate line SGD, a control gate electrode of the drain-side selection gate transistor STD, the lowermost-layer source-side selection gate line SGSb, and a control gate electrode of the lowermost-layer source-side selection gate transistor STSb. Increase in the laminating number of such conducting layers 102 possibly causes the substrate 101 to warp due to a property of material of this conducting layer 102. Increase in a magnitude of this warping makes a manufacture of a three-dimensional semiconductor memory device at a high yield difficult.

The plurality of conducting layers 102 are disposed in a staircase pattern at an end portion in an X direction. That is, the conducting layer 102 includes a contact portion 102a that is not opposed to an inferior surface of a conducting layer 102 positioned above the conducting layer 102, and this part configures a staircase-pattern wiring part. The conducting layer 102 is connected to a via contact wiring 109 at this contact portion 102a. The via contact wiring 109 has an upper end where a wiring 110 is disposed. The via contact wiring 109 and the wiring 110 are constituted of conducting layers such as tungsten.

The memory finger MF includes a conducting layer 108. The conducting layer 108 has a plate shape that is opposed to side surfaces in a Y direction of the plurality of conducting layers 102 and extends in the X direction and the Z direction. That is, the conducting layer 108 has a width in the X direction fully greater than a width in the Y direction (has a longitudinal direction in the X direction) in an X-Y plane, and has a width in the Z direction fully greater than the width in the Y direction (has a longitudinal direction in the Z direction) in a Y-Z plane. According to the embodiment, the width in the X direction of the conducting layer 108 is greater than the width in the Z direction. The conducting layer 108 has a lower end in contact with the substrate 101. The conducting layer 108 is made of, for example, metallic material such as tungsten (W), polysilicon including impurities, or combination of them. The conducting layer 108 functions as the source contact LI.

The memory finger MF includes a plurality of conducting layers 106 and a conducting layer 107. The plurality of conducting layers 106 and the conducting layer 107 are disposed above the plurality of conducting layers 102 and memory shafts 105. The plurality of conducting layers 106 are disposed in the X direction. The plurality of conducting layers 106 and the conducting layer 107 extend in the Y direction. The memory shafts 105 are each connected to the lower surfaces of the conducting layers 106. The conducting layer 106 is, for example, constituted of a conducting layer such as tungsten (W) and functions as the bit line BL. The conducting layer 108 is connected to the lower surface of the conducting layer 107. The conducting layer 107 is, for example, constituted of the conducting layer such as tungsten (W) and functions as the source line SL.

Figure 4:
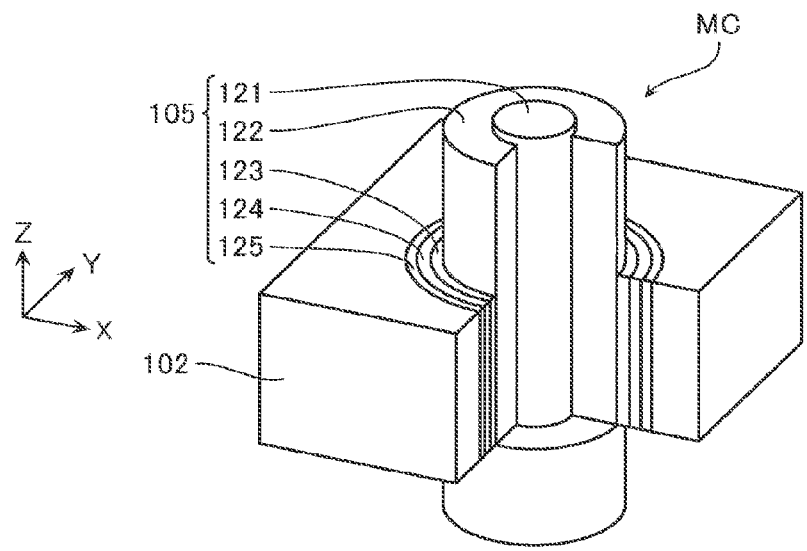
FIG. 4 is a perspective view that shows a part of the configuration of the non-volatile semiconductor memory device according to the first embodiment.

Next, with reference to FIG. 4, the following describes a schematic configuration of the memory cell MC. FIG. 4 is a schematic perspective view that shows the configuration of the memory cell MC. FIG. 4 shows the configuration of the memory cell MC. Note that the lowermost-layer source-side selection gate transistor STSb, the source-side selection gate transistor STS, and the drain-side selection gate transistor STD may also be configured similar to the memory cell MC. FIG. 4 omits a part of the configuration.

The memory cell MC is disposed at a portion where the conducting layer 102 intersects with the memory shaft 105. The memory shaft 105 includes, in an order from its center side, a core insulating layer 121, a semiconductor layer 122, a tunnel insulating layer 123, an electric charge accumulating layer 124, and a block insulating layer 125. The semiconductor layer 122 covers a sidewall of the core insulating layer 121.

The core insulating layer 121 is constituted of, for example, an insulating layer such as silicon oxide ($SiO_2$). The semiconductor layer 122 is constituted of, for example, a semiconductor layer such as silicon (Si), silicon germanium (SiGe), silicon carbide (SiC), and carbon (C). The semiconductor layer 122 functions as a channel for the memory cell MC, the lowermost-layer source-side selection gate transistor STSb, the source-side selection gate transistor STS, and the drain-side selection gate transistor STD. The tunnel insulating layer 123 is constituted of, for example, an insulating layer such as silicon oxide ($SiO_2$). The electric charge accumulating layer 124 is constituted of, for example, an insulating layer such as silicon nitride (SiN) that can accumulate electric charges. The block insulating layer 125 is constituted of, for example, an insulating layer such as silicon oxide ($SiO_2$).

Figure 5:
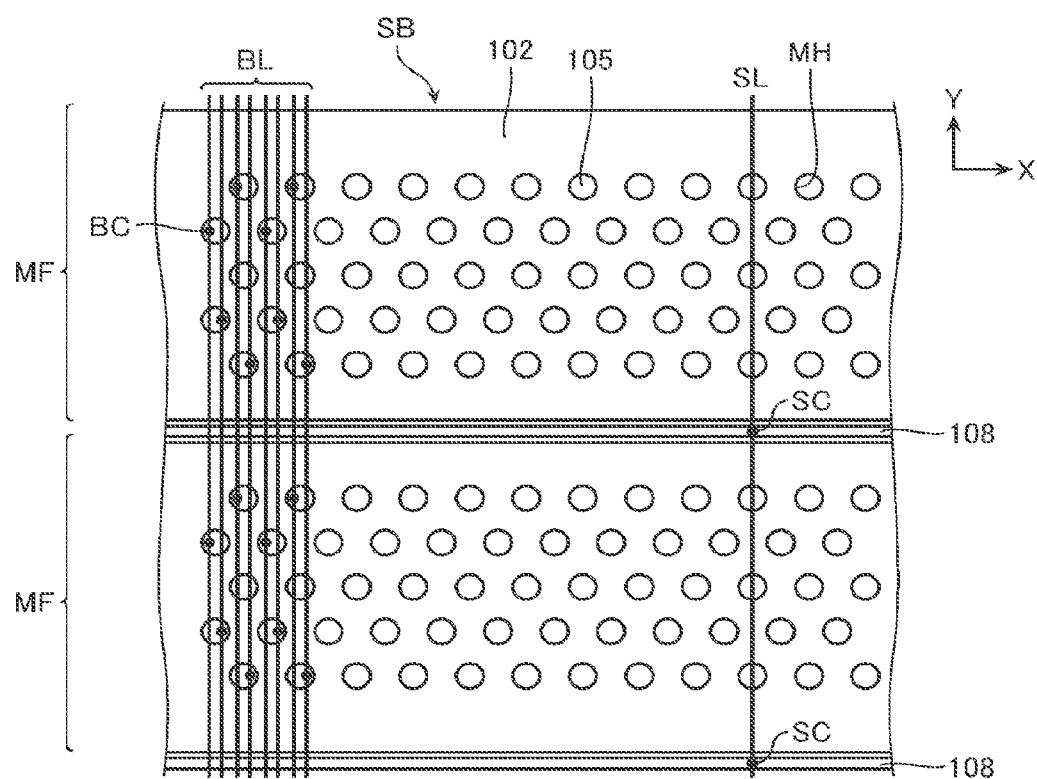
FIG. 5 is a plan view that shows a part of the configuration of the non-volatile semiconductor memory device according to the first embodiment.
Figure 6:
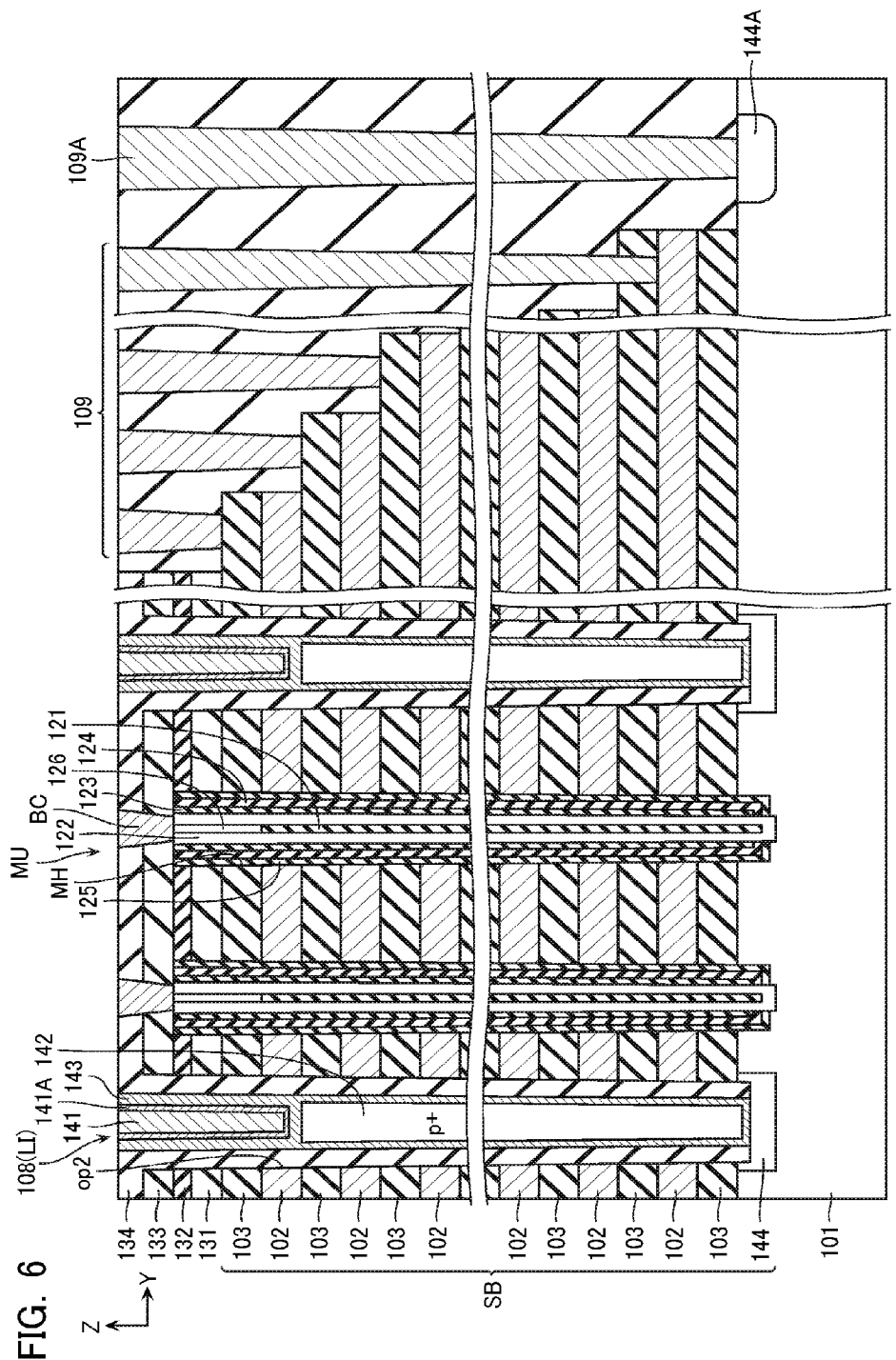
FIG. 6 is a cross-sectional view that shows a part of the configuration of the non-volatile semiconductor memory device according to the first embodiment.

Next, with reference to FIG. 5 to FIG. 6, the following describes the non-volatile semiconductor memory device according to the embodiment in more detail. FIG. 5 is a plan view that shows a part of the configuration of the memory cell array 1. FIG. 6 is a schematic cross-sectional view that shows the configuration of the memory cell array 1. FIG. 6 shows the memory unit MU and the source contact LI (the conducting layer 108) as main components at its left side, and schematically shows the staircase-pattern wiring part and contacts 109 and 109A at its right side.

As shown in FIG. 5, at the non-volatile semiconductor memory device according to the embodiment, the plurality of conducting layers 102, having longitudinal directions in the X direction, are arranged in the Y direction. These conducting layers 102, as shown in FIG. 6, are disposed on the substrate 101 with interposed interlayer insulating layers 103. That is, a laminated body SB where the conducting layers 102 and the interlayer insulating layers 103 are laminated in alternation is disposed on the substrate 101. Insulating layers 131 and 132 are further laminated on an upper side of the uppermost-layer interlayer insulating layer 103.

A plurality of memory holes MH are disposed in the X-Y plane to pass through this laminated body SB. The memory shaft 105 is disposed inside the memory hole MH. The memory shaft 105 is connected to the bit line BL via a bit line contact BC. The conducting layer 108 (the source contact LI) is disposed between the conducting layers 102, which are adjacent in the Y direction, via interlayer insulating layers (not shown). The conducting layer 108 is connected to the source line SL via a contact plug SC.

As described in FIG. 4, the core insulating layer 121, the semiconductor layer 122, the tunnel insulating layer 123, the electric charge accumulating layer 124, and the block insulating layer 125 are arranged in the memory hole MH in an order from its inside or in an order from its center side. A conducting layer 126 for an electrical connection with the bit line contact BC is disposed at an upper portion of the core insulating layer 121. The conducting layer 126 is disposed so that its side surface contacts the semiconductor layer 122.

The conducting layer 108 (the source contact LI) according to the embodiment has a lower end connected to the substrate 101, and an upper end connected to the source line SL. The source line SL is not shown in FIG. 6. However, the source line SL is connected to the conducting layer 108 via the contact plug SC.

The conducting layer 108 includes a metal layer 141, a barrier metal 141A, a silicide layer 142, a barrier metal 143, and a silicide layer 144. The conducting layer 108 is disposed inside an opening op2 via an insulating layer 134. The insulating layer 134 electrically insulates and disjoins the conducting layer 108 and the conducting layer 102.

The metal layer 141 configures an upper portion of the conducting layer 108. The metal layer 141 is constituted of, for example, metallic material such as tungsten (W). The metal layer 141 has a plate shape having a longitudinal direction in the Z direction. The barrier metal 141A is arranged at a position between the metal layer 141 and the barrier metal 143 around the metal layer 141. The barrier metal 141A is made of, for example, tungsten nitride (WN). The barrier metal 141A is disposed to reduce mutual reaction between the barrier metal 143 and the metal layer 141 and improve adhesion properties of them.

The silicide layer 142 configures a lower portion of the conducting layer 108. The silicide layer 142 is made of, for example, silicide of titanium (Ti), nickel (Ni), cobalt (Co), and the like. The silicide layer 142 is configured to a plate shape having a longitudinal direction in the Z direction. The silicide layer 142 has a lower end connected to the silicide layer 144 via the barrier metal 143. The silicide layer 142 may include p-type impurities (for example, boron), or n-type impurities (for example, phosphorus and arsenide) to enhance its conductive property. The impurities included in the silicide layer 142 may be any of the p-type impurities (elements of group III) and the n-type impurities (elements of group V). However, the p-type impurities are more preferable because of its low activation temperature of impurities and its less influence to other.

The barrier metal 143 is arranged to cover a bottom surface and a side surface of the metal layer 141 via the barrier metal 141A, and disposed to cover a top surface, a bottom surface, and aside surface of the silicide layer 142. The barrier metal 143 is made of, for example, titanium nitride (TiN). The arrangement of the barrier metal 143 between the silicide layer 144 and the silicide layer 142 reduces reaction between the silicide layer 144 and the silicide layer 142. The barrier metal 143 is interposed at a position between the metal layer 141 and the silicide layer 142. This reduces mutual reaction between the material of the metal layer 141 and the silicide of the silicide layer 142. The barrier metal 143 may be made of, for example, tantalum nitride (TaN) and tungsten nitride (WN) instead of titanium nitride (TiN).

The silicide layer 144 is a dual silicide including not only a silicide of transition metal whose atomic number is small (for example, titanium (Ti), nickel (Ni), cobalt (Co)), but also a silicide of metal atom whose atomic number (atomic radius) is larger than an atomic number of nickel (Ni, the atomic number is 28) such as platinum (Pt), tantalum (Ta), tungsten (W), hafnium (Hf), or NiPt. Such dual silicide has high temperature resistance compared with silicide including only metal atom whose atomic radius is small. For example, even if such dual silicide receives heat treatment with high temperature after film formation of the silicide layer 144, influence of, for example, what is called, agglomeration is small to decrease possibility to generate junction failure. For the silicide layer 144, for example, when making mixed crystal of nickel (Ni) and platinum (Pt), a content rate of platinum with respect to nickel may be around 10% to 20%. However, increasing a proportion of platinum ensures more reduced sheet resistivity of the silicide layer 144. The metal atom included in the silicide layer 144 maybe only metal atom whose atomic radius is large, such as platinum (the content rate of platinum is 100%).

On the other hand, the semiconductor memory device according to the embodiment also includes a contact 109A separately from the conducting layer 108 that functions as the source contact LI. The contact 109A has a lower end connected to a transistor that configures a peripheral circuit, and an upper end connected to other wiring (not shown) separately from the source line SL. This contact 109A is electrically connected to the substrate 101 via a silicide layer 144A disposed on the substrate 101. This silicide layer 144A, unlike the silicide layer 144, may be made of only silicide of the metal atom whose atomic radius is small, such as nickel (Ni), and may not include the metal atom whose atomic radius is large.

Thus, the silicide layer 144 includes metallic material whose atomic radius is larger than the one of nickel, such as platinum (Pt), tantalum (Ta), tungsten (W), or hafnium (Hf). Since the source contact LI (the conducting layer 108) is a part where cell current flowing through the memory string MS flows, its resistance value is preferred to be decreased. High resistance of silicide layer 144 restrains the cell current from flowing. When the silicide layer 144 includes only the metal atom whose atomic radius is small, such as nickel, nickel atoms spread by a thermal process to generate, what is called, the agglomeration. If the agglomeration is generated, the sheet resistivity of the silicide layer 144 increases, and the resistance value of the conducting layer 108 increases. This makes ensuring the sufficient cell current difficult. If the silicide layer 144 includes the metallic material whose atomic radius is larger than the one of nickel, such as platinum (Pt), tantalum (Ta), tungsten (W), or hafnium (Hf), such agglomeration can be reduced to reduce the high resistance of the silicide layer 144.

In contrast, the contact 109A, unlike the conducting layer 108 that configures the source contact LI, does not flow the cell current. Accordingly, the contact 109A is not severely required to reduce its resistance value compared with the conducting layer 108. Thus, since the silicide layer 144A is not necessary to reduce severely the agglomeration compared with the silicide layer 144, the silicide layer 144A may be silicide of only the metal atom whose atomic radius is small, such as nickel (Ni).

As described above, the increase in the laminating number of the conducting layers 102 possibly causes the substrate 101 to warp due to the property of the material of the conducting layer 102. Additionally, increase in a height in a laminating direction of the conducting layer 108 also possibly causes the substrate 101 to warp. More specifically, since the coefficient of thermal expansion differs between the material such as silicon used for the substrate 101 and the metallic material such as the tungsten, tensile stress occurs to the substrate 101 after film formation of the tungsten. This may generate the above-described warping of the substrate 101. In this respect, in the above-described exemplary configuration in FIG. 6, the conducting layer 108 is constituted of a laminated structure of the metal layer 141 such as tungsten and the silicide layer 142. This preferably ensures the reduced above-described stress compared with a case forming the entire conducting layer 108 with the metallic material such as tungsten. Selecting appropriately the metallic material of the metal layer 141 and the metallic material of the silicide layer 142 ensures an offset of both stresses by making one a material providing a shrinkage stress and making the other an expanding material.

However, when the silicide layer 142 exists as in FIG. 6, the thermal process is necessary to activate impurities included in polysilicon deposited at a manufacturing process of the silicide layer 142. Temperature required for the thermal process is typically 700° C. or more, very high. When such high heat is applied, what is called, the agglomeration occurs at a silicide layer formed on the substrate, which causes the silicide layer to have a high resistance and possibly causes the junction failure. However, the embodiment makes the silicide layer 144 a silicide layer of the metal atom whose atomic radius is larger than the one of nickel (Ni) to reduce this agglomeration. That is, using the metal atom whose atomic radius is large can reduce the agglomeration even after the thermal process with high temperature to reduce the high resistance and the junction failure of the silicide layer 144.

Method for Manufacturing

Next, the following describes a method for manufacturing the non-volatile semiconductor memory device according to the first embodiment with reference to FIG. 7 to FIG. 18. FIG. 7 to FIG. 18 are cross-sectional views for describing the method for manufacturing according to the first embodiment.

Figure 7:
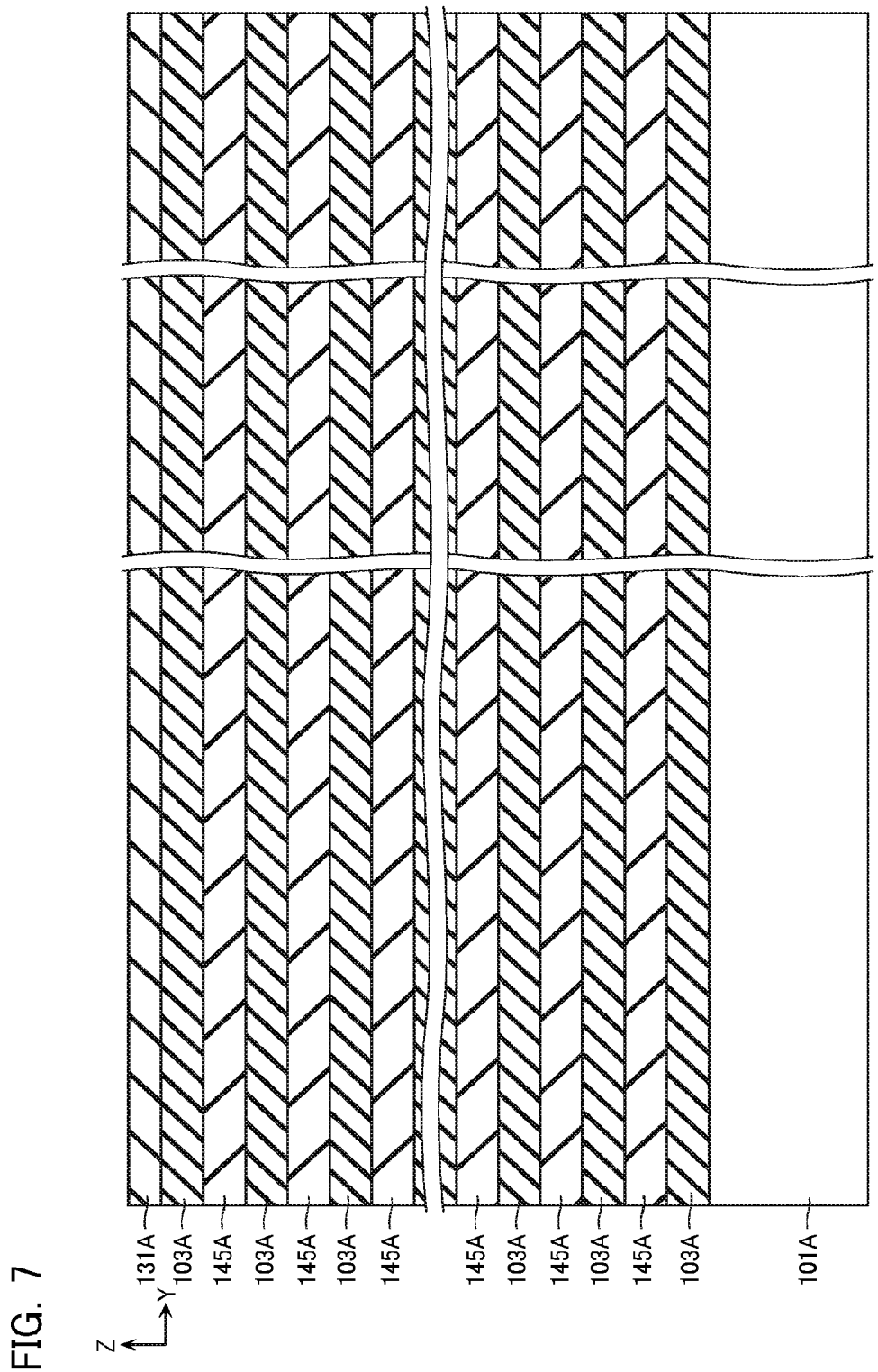
FIG. 7 to FIG. 18 are cross-sectional views that shows manufacturing processes of the non-volatile semiconductor memory device according to the first embodiment.

As shown in FIG. 7, in the method for manufacturing according to the embodiment, a plurality of sacrificial layers 145A and interlayer insulating layers 103A (equivalent to the above-described interlayer insulating layers 103) are laminated in alternation on a substrate 101A. Further, an insulating layer 131A (equivalent to the above-described insulating layer 131) is laminated on an upper side of the uppermost-layer interlayer insulating layer 103A. The interlayer insulating layer 103A is made of, for example, silicon oxide ($SiO_2$). The sacrificial layer 145A and the insulating layer 131A are made of, for example, silicon nitride (SiN). The sacrificial layer 145A, as described later, is a film removed by wet etching. Metallic material that will be the conducting layer 102 is embedded after removing the sacrificial layer 145A.

Figure 8:
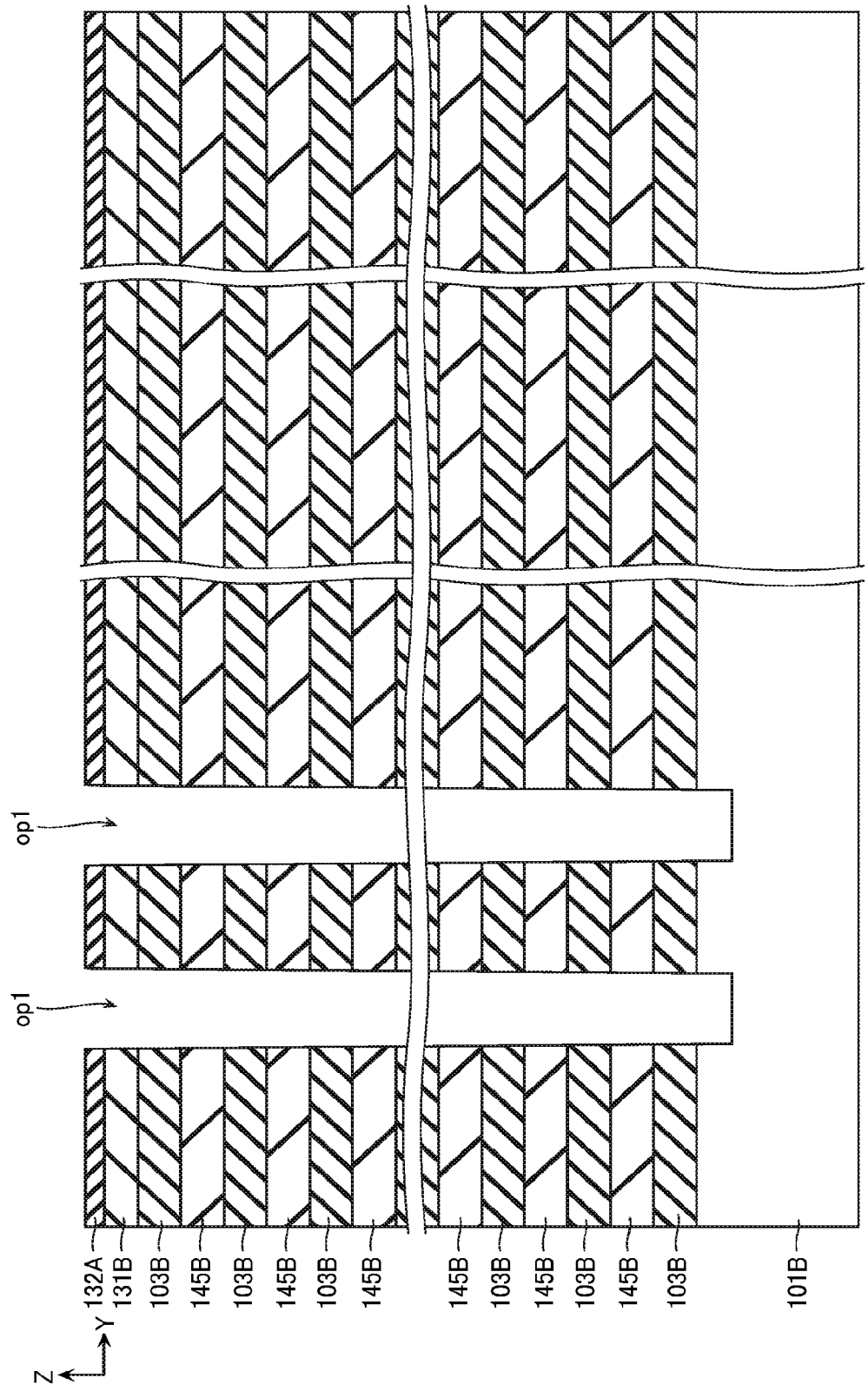

Next, as shown in FIG. 8, an insulating layer 132A (equivalent to the above-described insulating layer 132) is laminated on the insulating layer 131A. Then, an opening op1, which passes through an upper portion of the substrate 101A, the interlayer insulating layer 103A, the sacrificial layer 145A, and the insulating layer 131A using the insulating layer 132A as a mask, is formed to form a substrate 101B, an interlayer insulating layer 103B, a sacrificial layer 145B, and an insulating layer 131B where the opening op1 is disposed.

Figure 9:
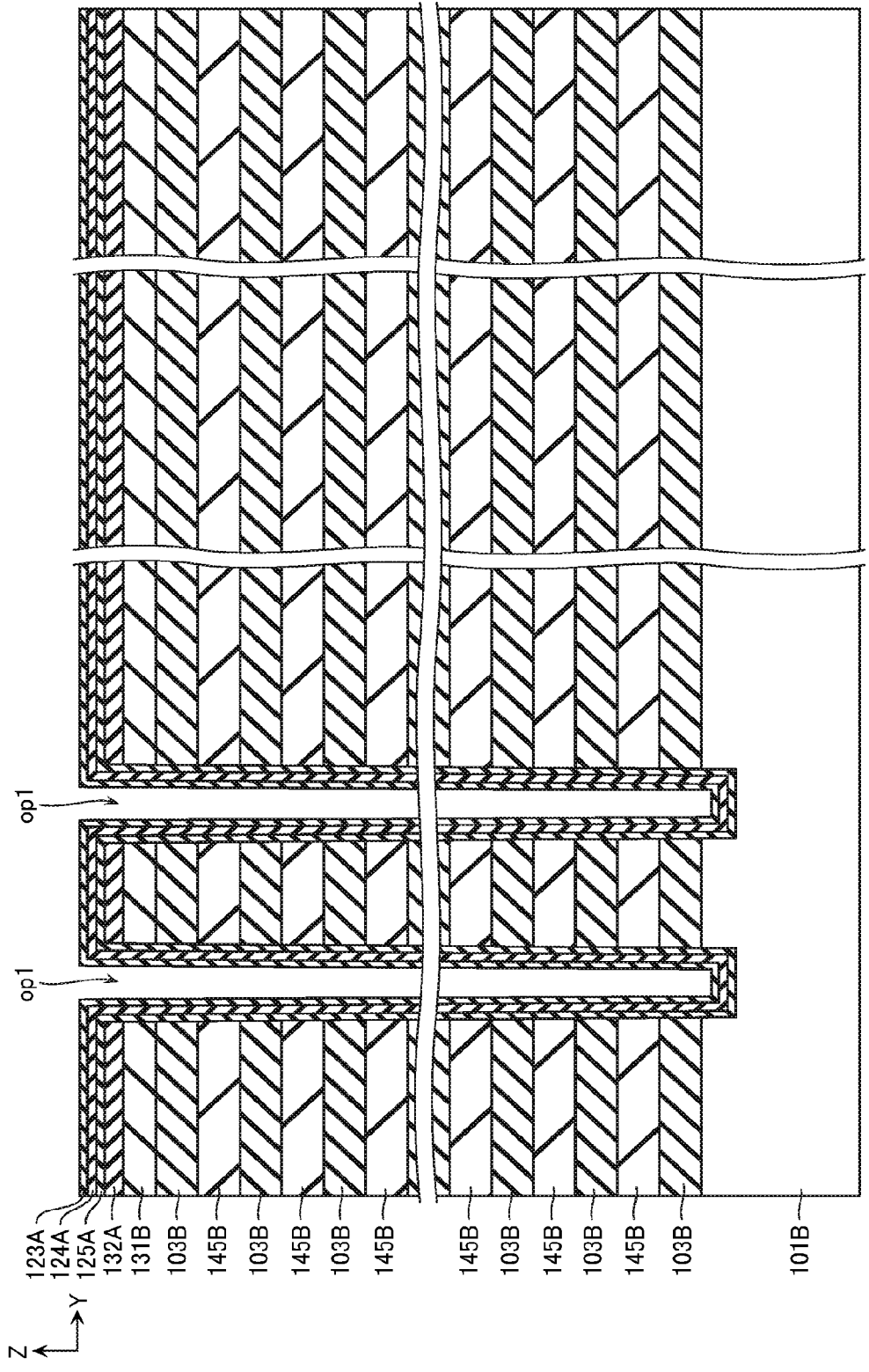

Next, as shown in FIG. 9, a block insulating layer 125A (equivalent to the block insulating layer 125), an electric charge accumulating layer 124A (equivalent to the electric charge accumulating layer 124), and a tunnel insulating layer 123A (equivalent to the tunnel insulating layer 123) are formed on atop surface of the insulating layer 132A and inner wall of the opening op1, for example, by using a CVD method.

Figure 10:
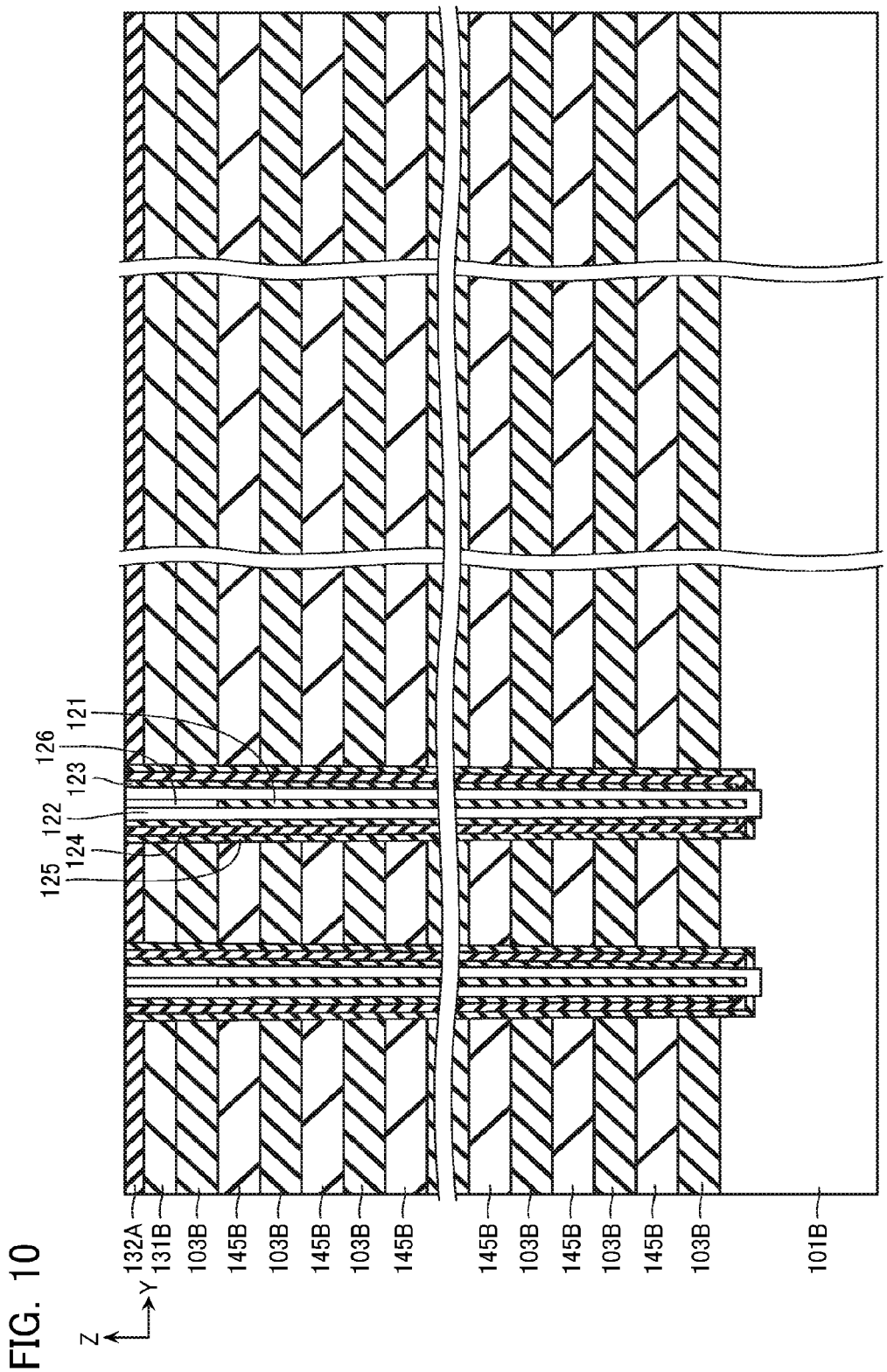

Next, as shown in FIG. 10, the block insulating layer 125A, the electric charge accumulating layer 124A, and the tunnel insulating layer 123A, which are positioned at a bottom surface of the opening op1, are removed, for example, by anisotropic etching to form the block insulating layer 125, the electric charge accumulating layer 124, and the tunnel insulating layer 123. Next, the semiconductor layer 122 is formed on a sidewall of the tunnel insulating layer 123, and further, the core insulating layer 121 and the conducting layer 126 are embedded in a hollow that remains at an inner wall of the semiconductor layer 122.

Figure 11:
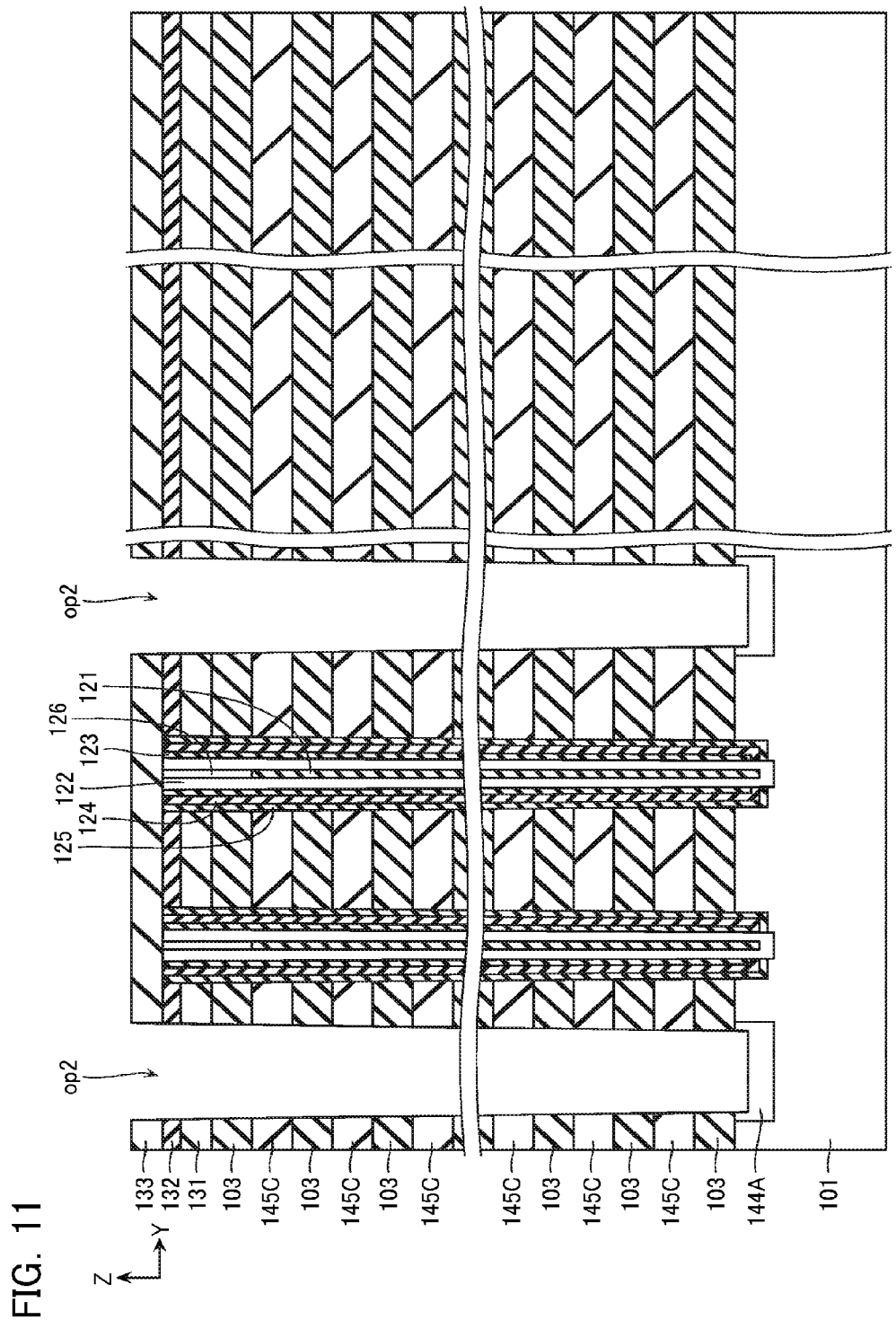

Next, as shown in FIG. 11, an insulating layer 133 is formed on a top surface of the insulating layer 132. Then, an opening op2, which passes through an upper portion of the substrate 101B, the interlayer insulating layer 103B, the sacrificial layer 145B, the insulating layer 131B, and the insulating layer 132A using the insulating layer 133 as a mask, is formed to form the substrate 101, the interlayer insulating layer 103, a sacrificial layer 145C, the insulating layer 131, and the insulating layer 132 where the opening op2 is disposed. The opening op2 corresponds to a position of the above-described source contact LI. Formation of the opening op2 is performed by means such as dry etching. The interlayer insulating layer 103, the sacrificial layer 145C, the insulating layer 131, and the insulating layer 132 are separated in the Y direction via the opening op2. Next, metal atom such as platinum (Pt), tantalum (Ta), tungsten (W), or hafnium (Hf) is injected into the substrate 101 via the opening op2 by using a sputtering method or similar method to form a metal injecting layer 144A (equivalent to the above-described silicide layer 144).

Figure 12:
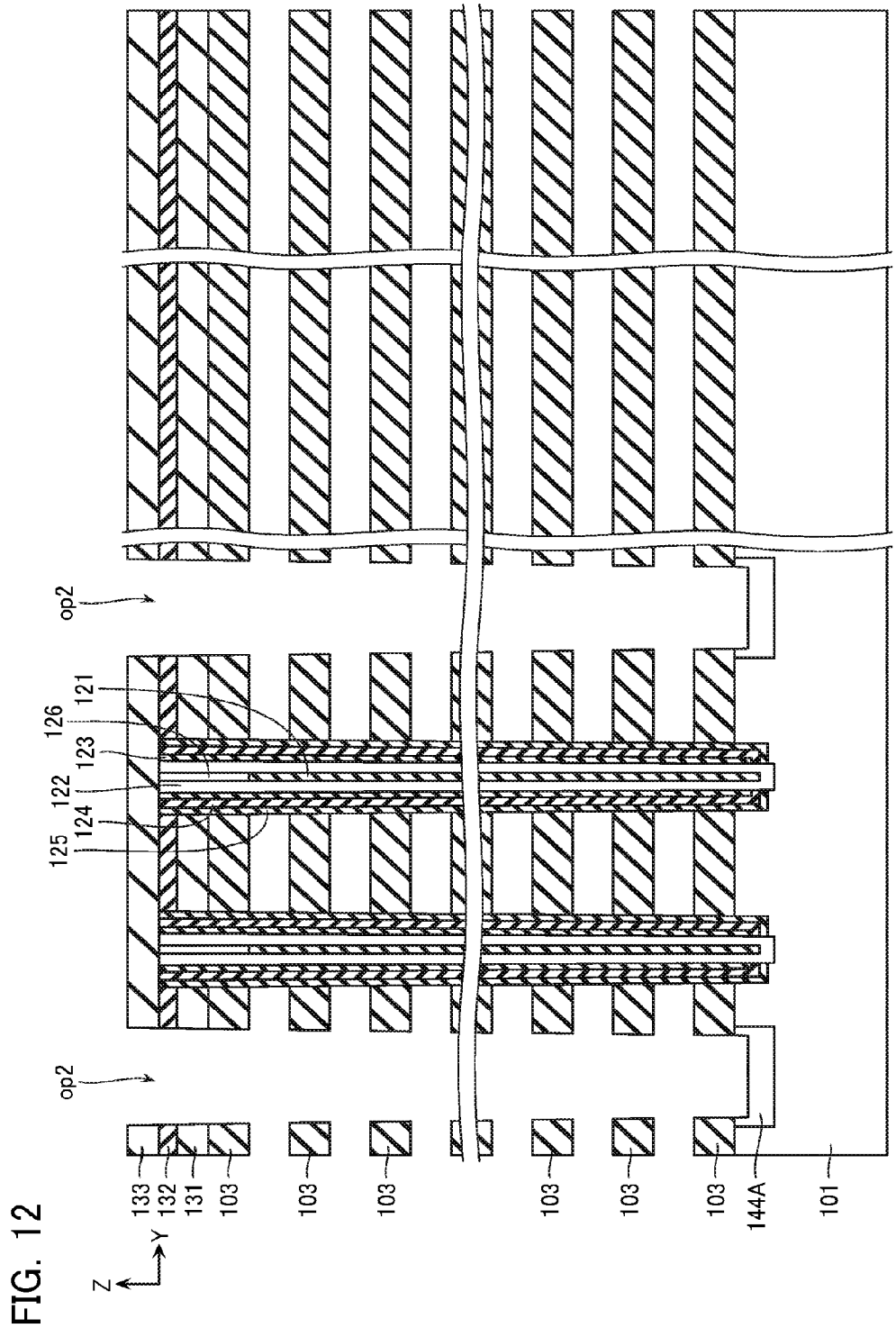
Figure 13:
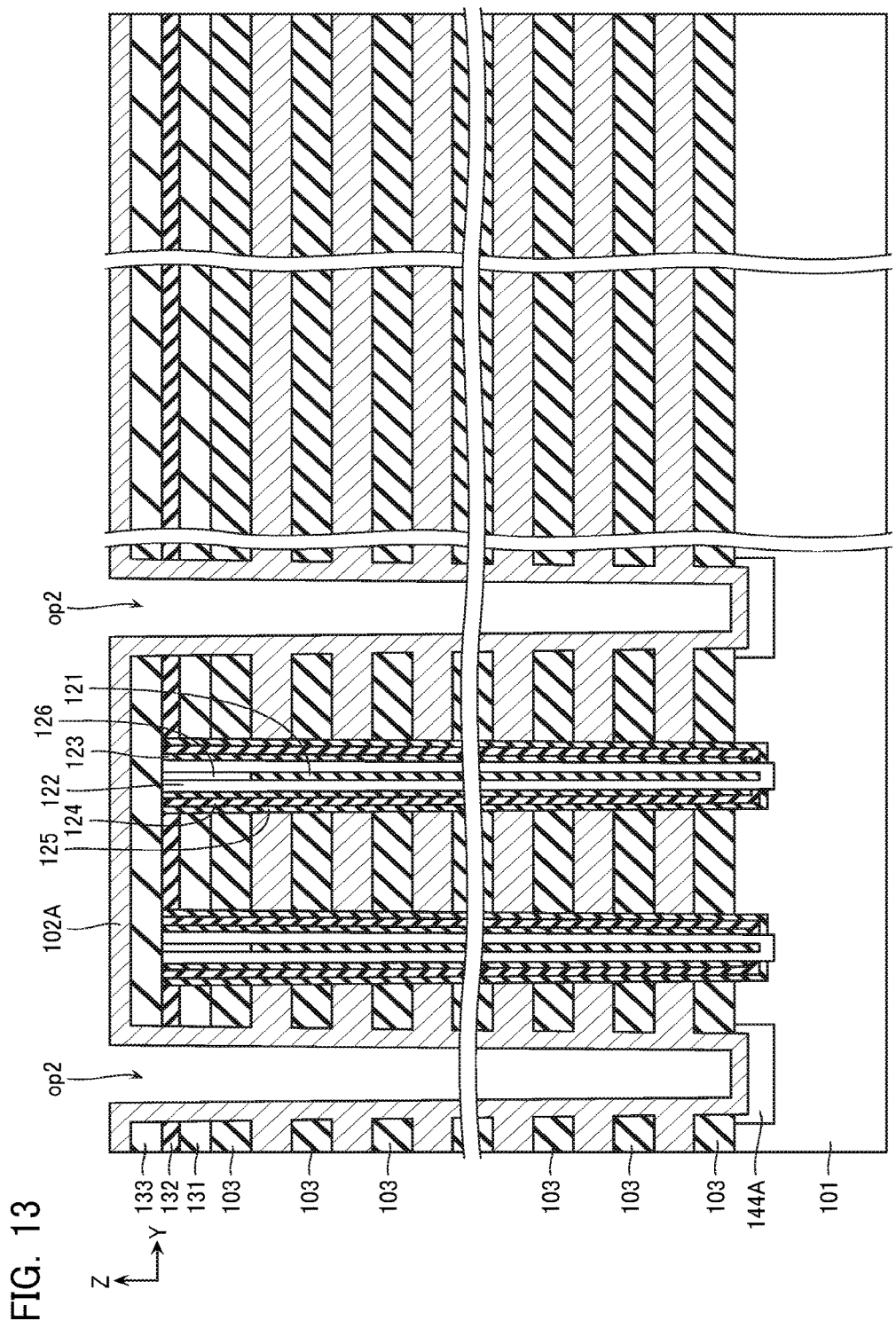

Next, as shown in FIG. 12, wet etching by using phosphoric acid solution is performed to remove the sacrificial layer 145C via the opening op2. Then, as shown in FIG. 13, a conducting layer 102A (equivalent to the conducting layer 102) is deposited between the interlayer insulating layers 103, which are adjacent in the Z direction, by using a PVD (physical vapor deposition) method or similar method. The conducting layer 102A is formed between the laminated interlayer insulating layers 103 via the opening op2.

Figure 14:
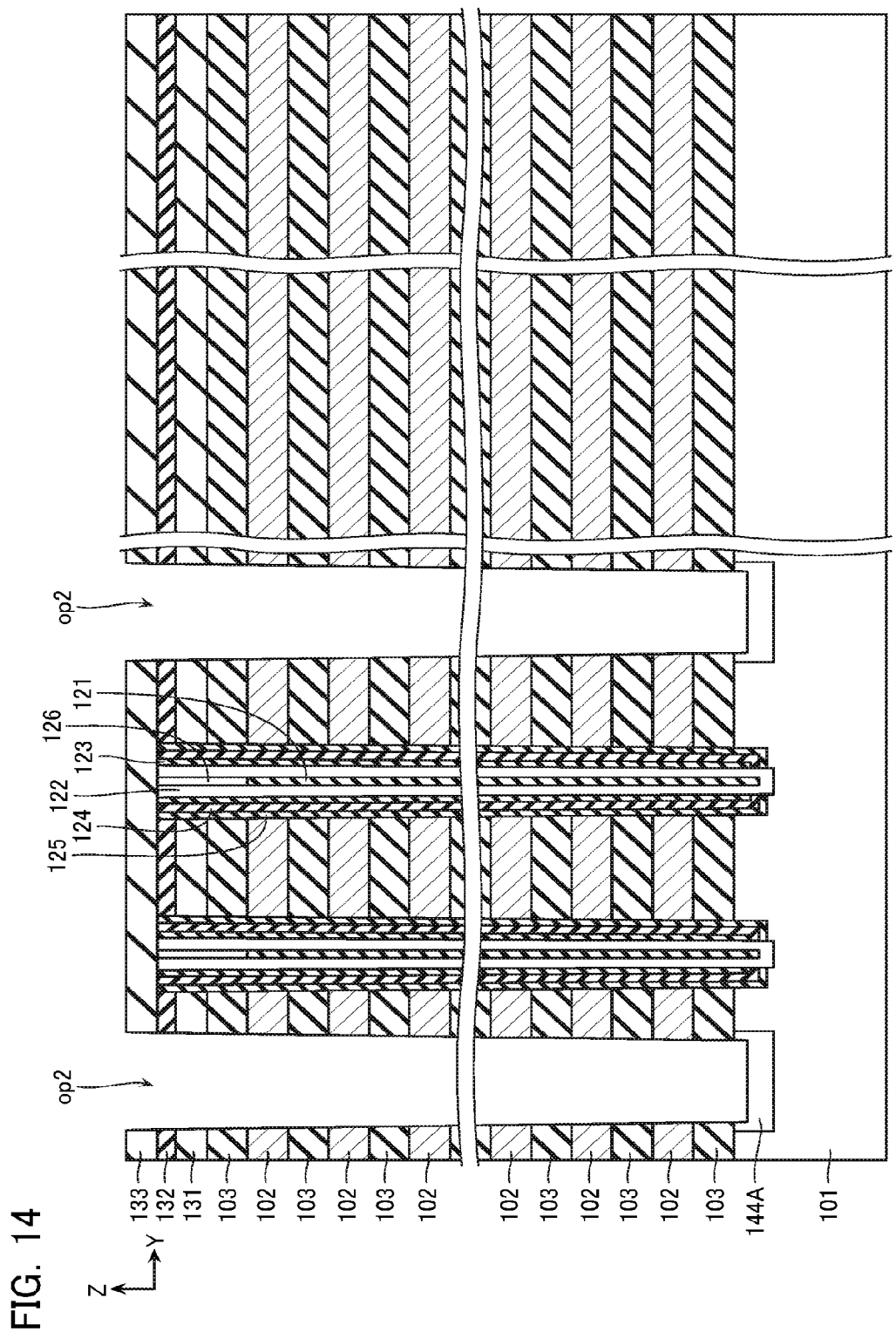

Next, as shown in FIG. 14, a part covering a top surface of the insulating layer 133 and a part covering a sidewall of the interlayer insulating layer 103 in the conducting layer 102A are removed by anisotropic etching to form the plurality of conducting layers 102 separated in the Z direction.

Figure 15:
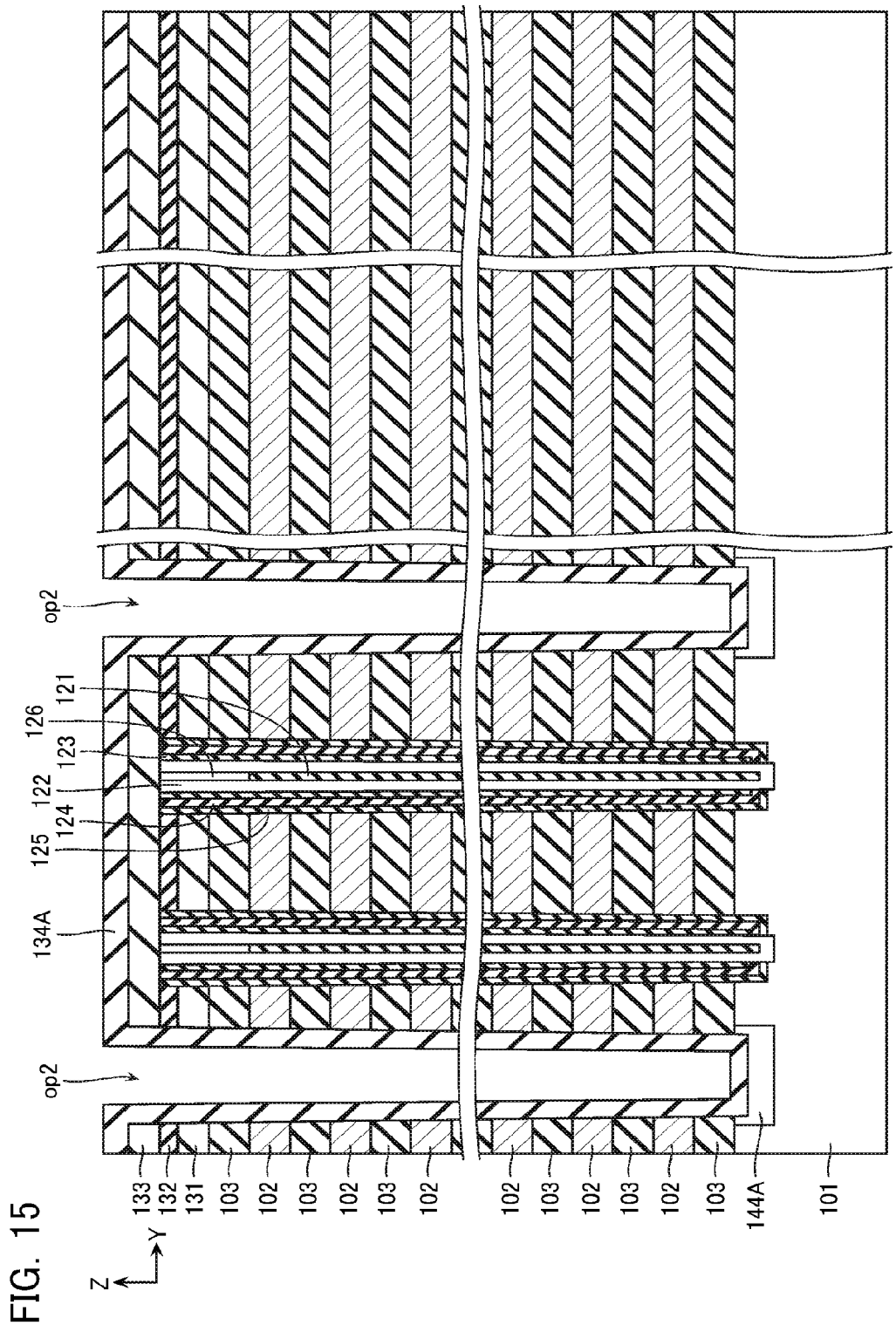
Figure 16:
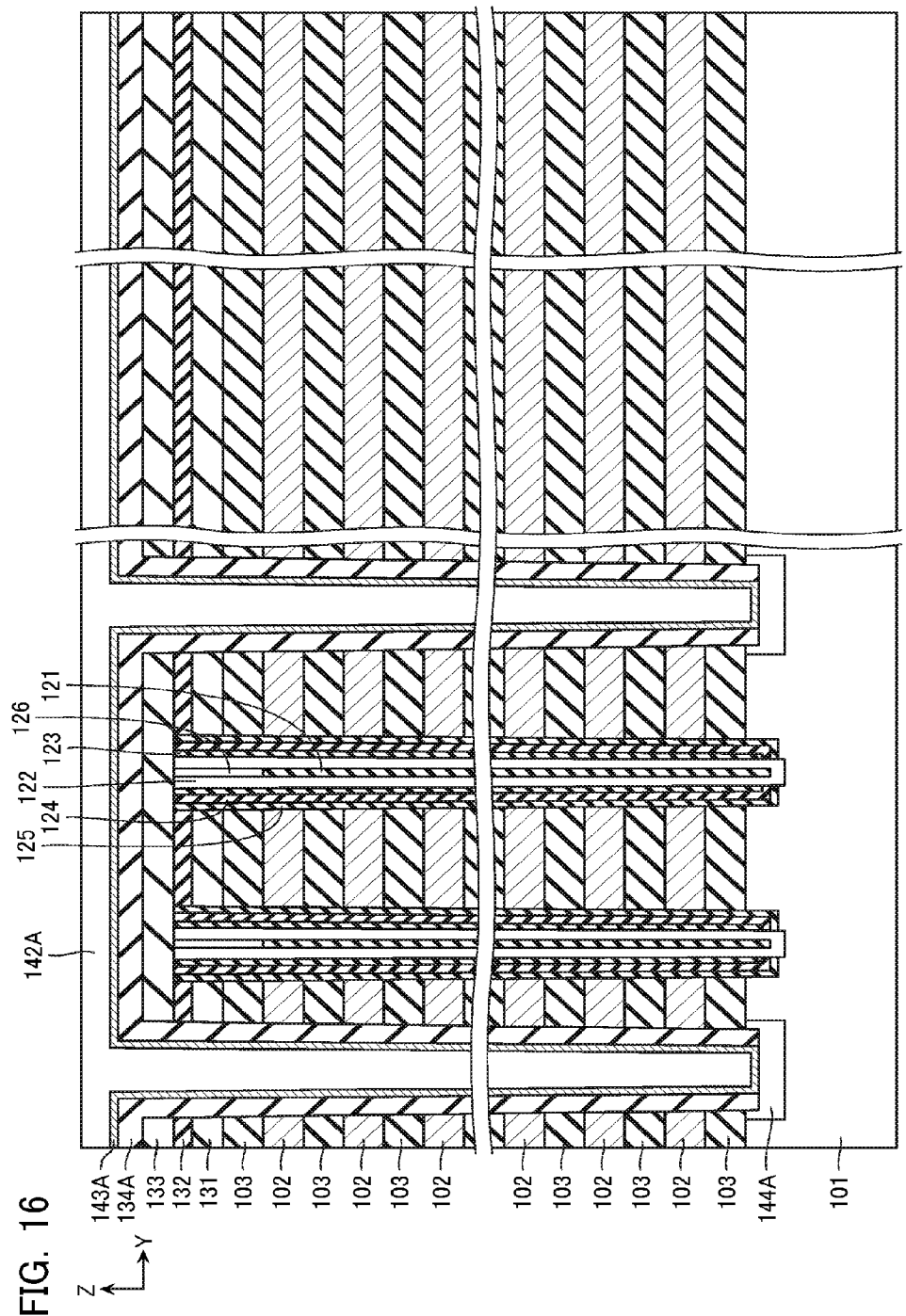

Next, as shown in FIG. 15, an insulating layer 134A (equivalent to the above-described insulating layer 134) is formed on the top surface of the insulating layer 133, a side surface of the opening op2, and a bottom surface of the opening op2. Then, as shown in FIG. 16, the insulating layer 134A (the insulating layer 134) positioned on the bottom surface of the opening op2 is removed to expose the substrate 101 (the metal injecting layer 144A) positioned on the bottom surface of the opening op2. Subsequently, a conducting layer 143A (equivalent to the barrier metal 143) is formed on an inner wall of the opening op2 and a surface of the insulating layer 134. Further, as filling the opening op2, a polysilicon layer 142A (equivalent to the above-described silicide layer 142) is embedded by using the CVD method or similar method. The conducting layer 143A is formed by, for example, forming a film of material such as titanium nitride (TiN). The polysilicon layer 142A may include p-type or n-type impurities.

Figure 17:
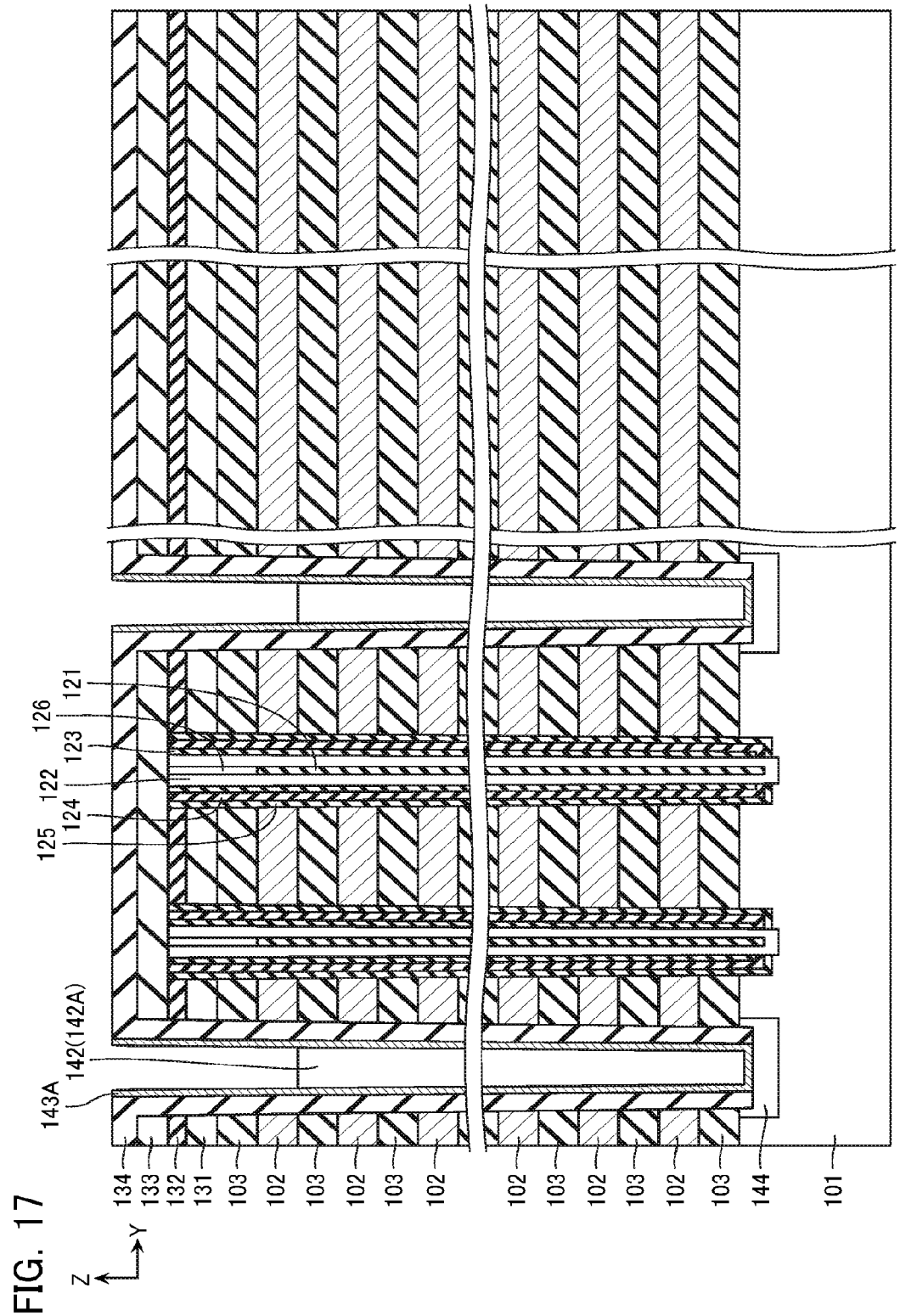
Figure 18:
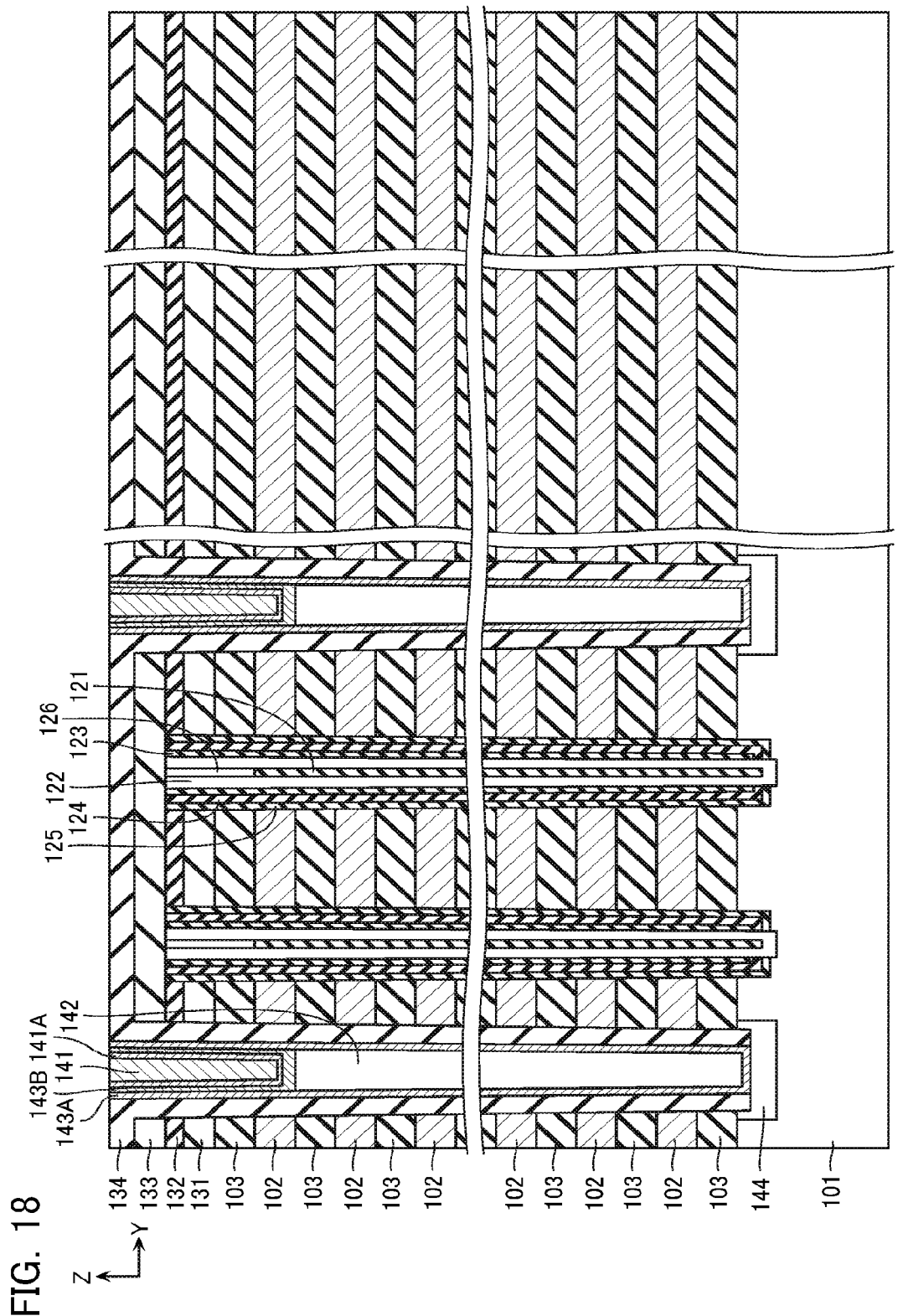

Next, as shown in FIG. 17, wet etching, dry etching, or similar etching is performed to etch the polysilicon layer 142A back to a predetermined height. At this time, a structure having voids in polysilicon is formed by film formation of the polysilicon layer 142A. In a later silicidizing, metallic material is embedded inside the voids to ensure acceleration of partly silicidizing or fully silicidizing. Then, metallic material for silicidizing the polysilicon layer 142A is deposited on a surface of the polysilicon layer 142A. Then, a thermal process, for example, at around 400° C. to 750° C. is performed for a predetermined time to silicidize the polysilicon layer 142A to form the silicide layer 142. The metallic material that remains on the surface after silicidizing is removed by wet etching. Depending on the type of the metallic material, the silicide layer 142 may expand to form voids inside. Afterwards, as described above, at the film formation of the polysilicon layer 142A, even when the structure having the voids in polysilicon is consciously formed, the voids may be consequently formed inside. Even in such structure having the voids, the voids are continuously formed having a longitudinal direction in a vertical direction (a laminating direction). This does not increase contact resistance. Thereafter, as shown in FIG. 18, a conducting layer 143B, which material is identical to that of the conducting layer 143A, is deposited on the opening op2 above the silicide layer 142. Then, the opening op2 is embedded with the barrier metal 141A and the metal layer 141. Thus, the structure shown in FIG. 6 is completed. The barrier metal 141A and the metal layer 141 can be performed, for example, by the PVD method. However, the barrier metal 141A and the metal layer 141 may be performed by a method such as the CVD (chemical vapor deposition) method.

Figure 19:
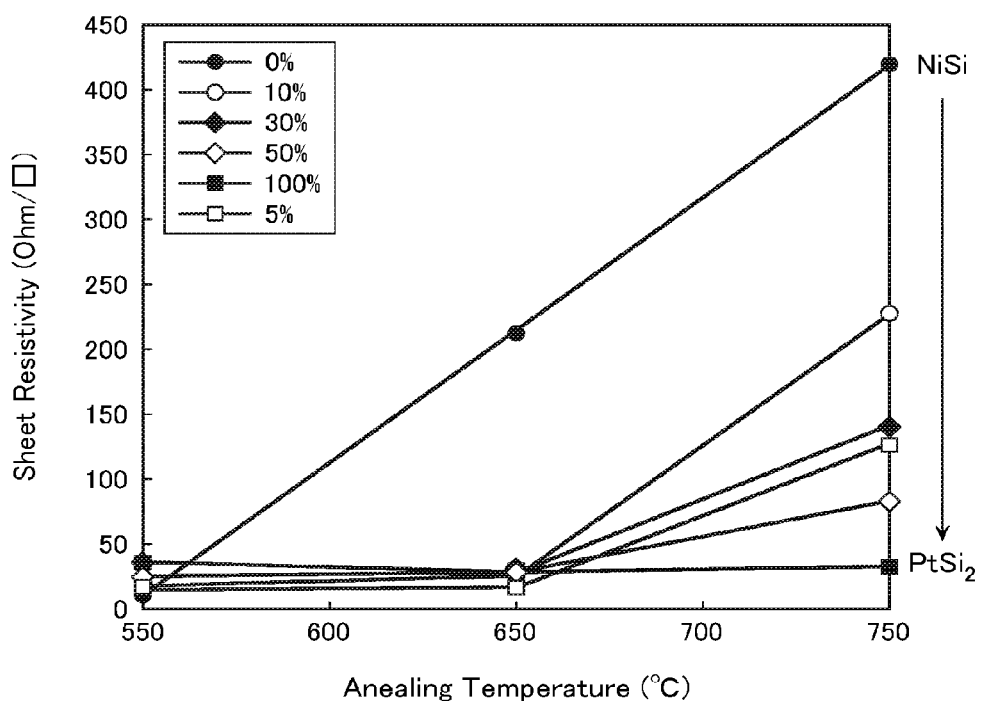
FIG. 19 is a graph that describes an effect of the first embodiment.

FIG. 19 is a graph that shows a relationship between temperature at the thermal process (annealing temperature) and value of the sheet resistivity of the silicide layer 144 after the thermal process, at the semiconductor memory device of the first embodiment. FIG. 19 is a graph, where the metal atoms included in the silicide layer 144 are nickel (Ni) and platinum (Pt), that has the intergraded content rate of platinum between 0% and 100% to examine the sheet resistivity in the respective cases.

As shown in FIG. 19, in the case where the content rate of platinum in the silicide layer 144 is low, the sheet resistivity of the silicide layer 144 substantially increases when the annealing temperature is 700° C. or more. However, it is found that even when the annealing temperature is 700° C. or more, as the content rate of platinum in the silicide layer 144 increases, the increase in the sheet resistivity of the silicide layer 144 is also reduced. This is estimated that since the platinum atom in the silicide layer 144 is larger than the silicon atom in the substrate 101, the platinum atom does not easily move even by the thermal process. It is estimated that such trend is similar to even a case where the metal atom having a large atomic radius included in the silicide layer 144 is changed from platinum (Pt) to, for example, tungsten (W), tantalum (Ta), hafnium (Hf), or similar metal atom.

[Second Embodiment]

Figure 20:
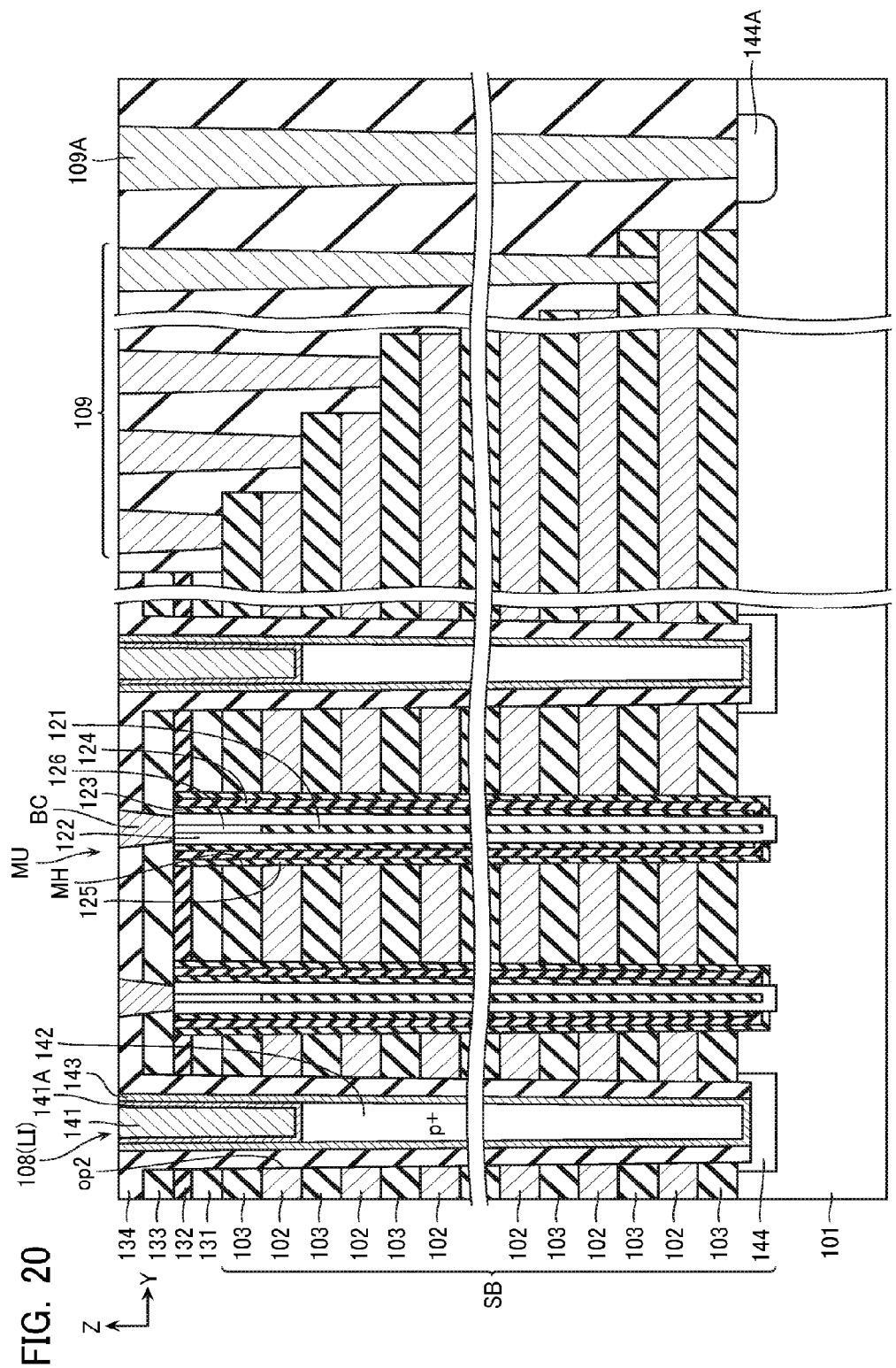
FIG. 20 is a cross-sectional view that shows a part of a configuration of a non-volatile semiconductor memory device according to a second embodiment.

Next, with reference to FIG. 20, the following describes a configuration of anon-volatile semiconductor memory device according to a second embodiment. The overall configuration of this second embodiment is similar to that of the first embodiment (FIG. 1 to FIG. 5). Therefore, the overlapped description will not be further elaborated here. In this second embodiment, as shown in FIG. 20, the barrier metal 143 is not sandwiched between the silicide layer 142 and the metal layer 141, and only the barrier metal 141A is disposed. In this respect, the second embodiment differs from the first embodiment. When only the barrier metal 141A can sufficiently reduce the mutual reaction between the silicide layer 142 and the metal layer 141, this eliminates a need for the process depositing additionally the barrier metal 143 (143B in FIG. 18). Accordingly, the number of processes can be reduced compared with the first embodiment.

[Third Embodiment]

Figure 21:
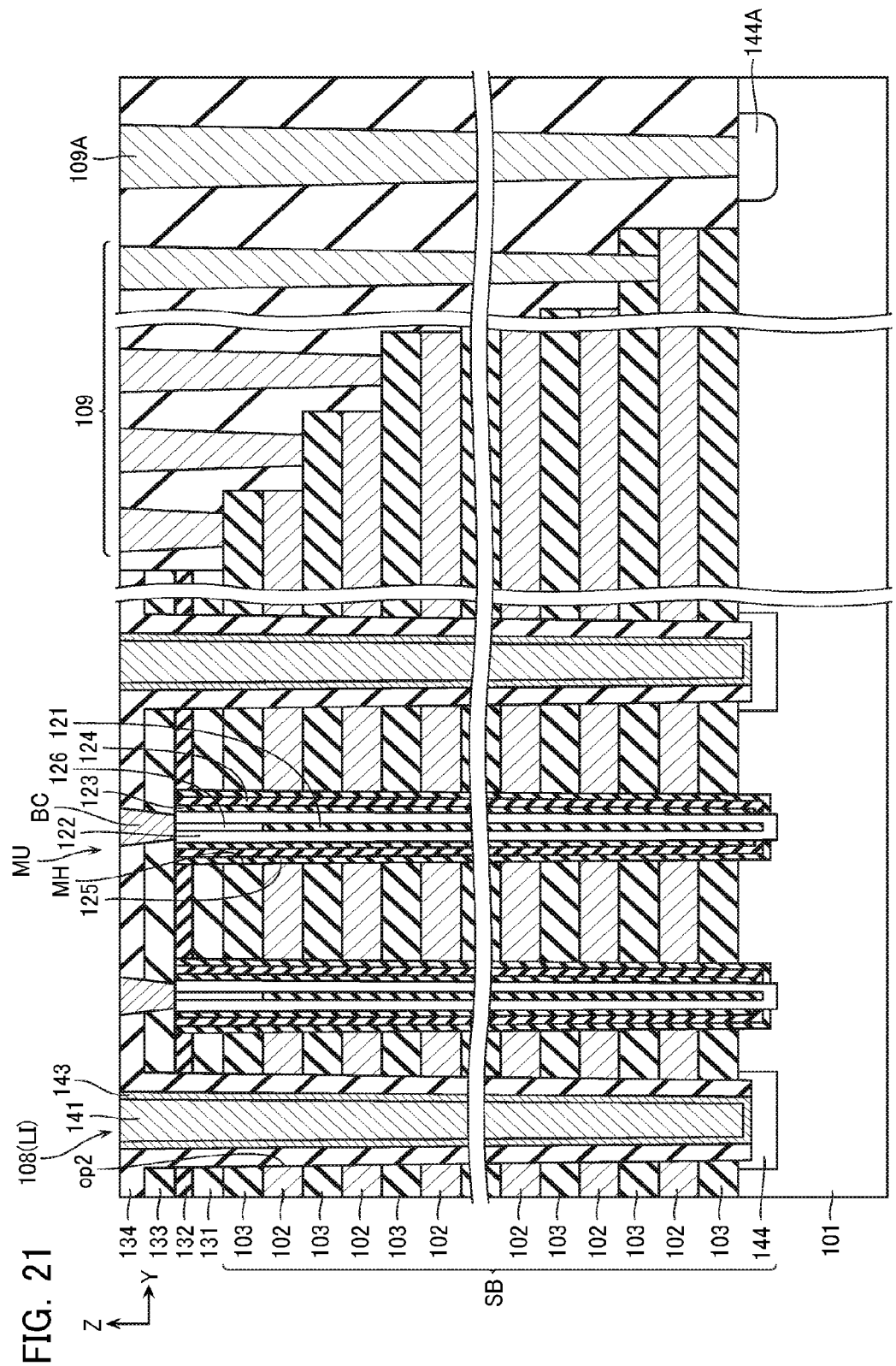
FIG. 21 is a cross-sectional view that shows a part of a configuration of a non-volatile semiconductor memory device according to a third embodiment.

Next, with reference to FIG. 21, the following describes a configuration of anon-volatile semiconductor memory device according to a third embodiment. The overall configuration of this third embodiment is similar to that of the first embodiment (FIG. 1 to FIG. 5). Therefore, the overlapped description will not be further elaborated here. In this third embodiment, as shown in FIG. 21, the conducting layer 108 constituting the source contact LI is constituted of the metal layer 141 from its upper end to its lower end (does not have the silicide layer 142). In this respect, the third embodiment differs from the above-described embodiments. The silicide layer 144, similar to the one of the above-described embodiments, is a silicide layer including the metal atom whose atomic radius is large, such as platinum (Pt). This silicide layer 144 is connected to the metal layer 141 only via the barrier metal 141A. Even in this third embodiment, the silicide layer 144 includes the metal atom whose atomic radius is large, such as platinum (Pt). Even through the thermal process with high temperature, the reduction of its sheet resistivity can be reduced.

[Fourth Embodiment]

Figure 22:
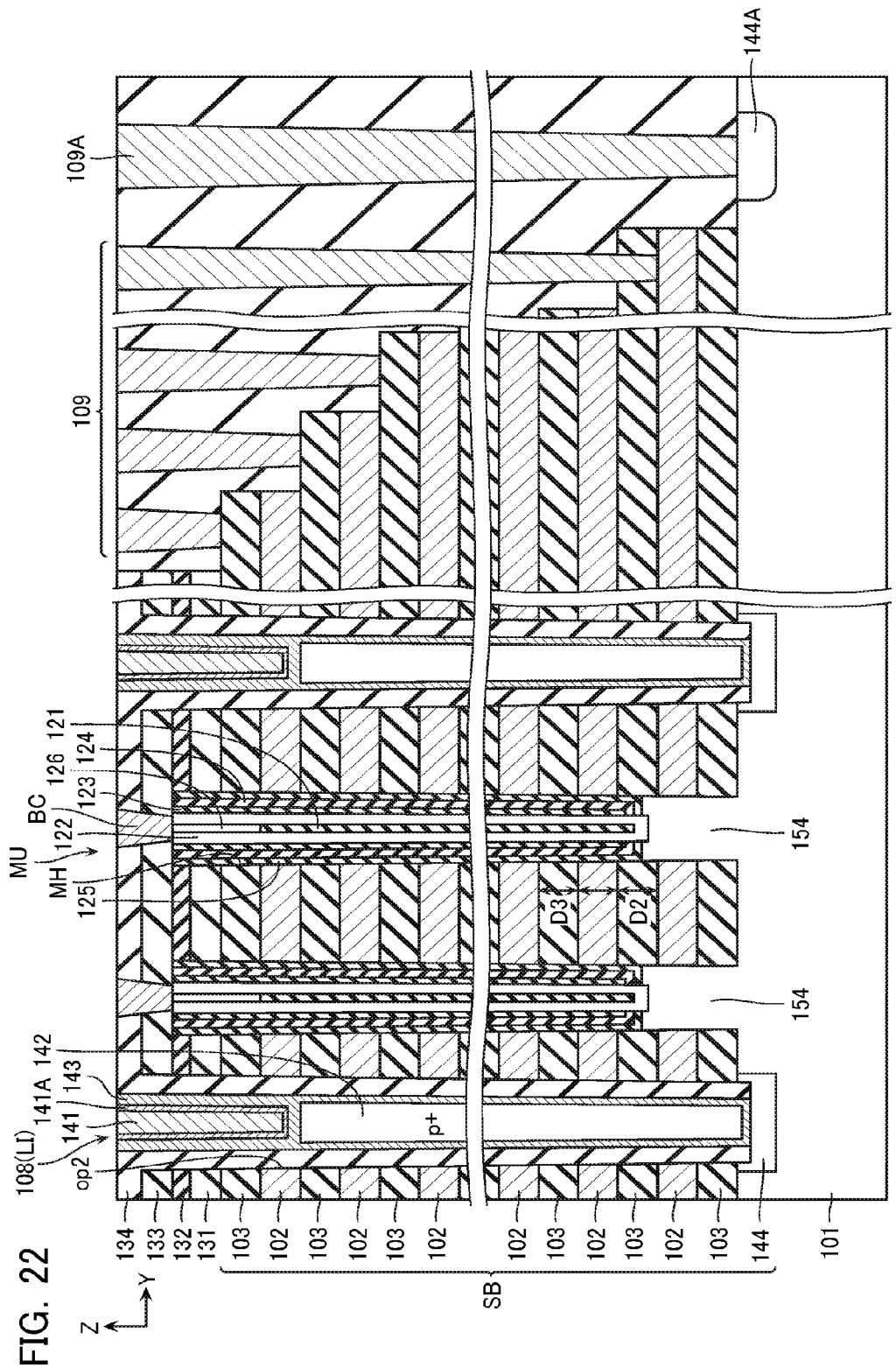
FIG. 22 is a cross-sectional view that shows a part of a configuration of a non-volatile semiconductor memory device according to a fourth embodiment.

Next, with reference to FIG. 22, the following describes a configuration of anon-volatile semiconductor memory device according to a fourth embodiment. The overall configuration of this fourth embodiment is similar to that of the first embodiment (FIG. 1 to FIG. 5). Therefore, the overlapped description will not be further elaborated here. In this fourth embodiment, as shown in FIG. 22, an epitaxial layer 154 is disposed between a lower end of the semiconductor layer 122 constituting the memory unit MU and the substrate 101. In this respect, the fourth embodiment differs from the above-described embodiments. This epitaxial layer 154 is a single crystal silicon layer formed by an epitaxial growth from silicon of the substrate 101 in the memory hole MH. The interposition of this epitaxial layer 154 between the substrate 101 and the semiconductor layer 122 ensures the reduction of the contact resistance of the memory unit MU.

[Fifth Embodiment]

Figure 23:
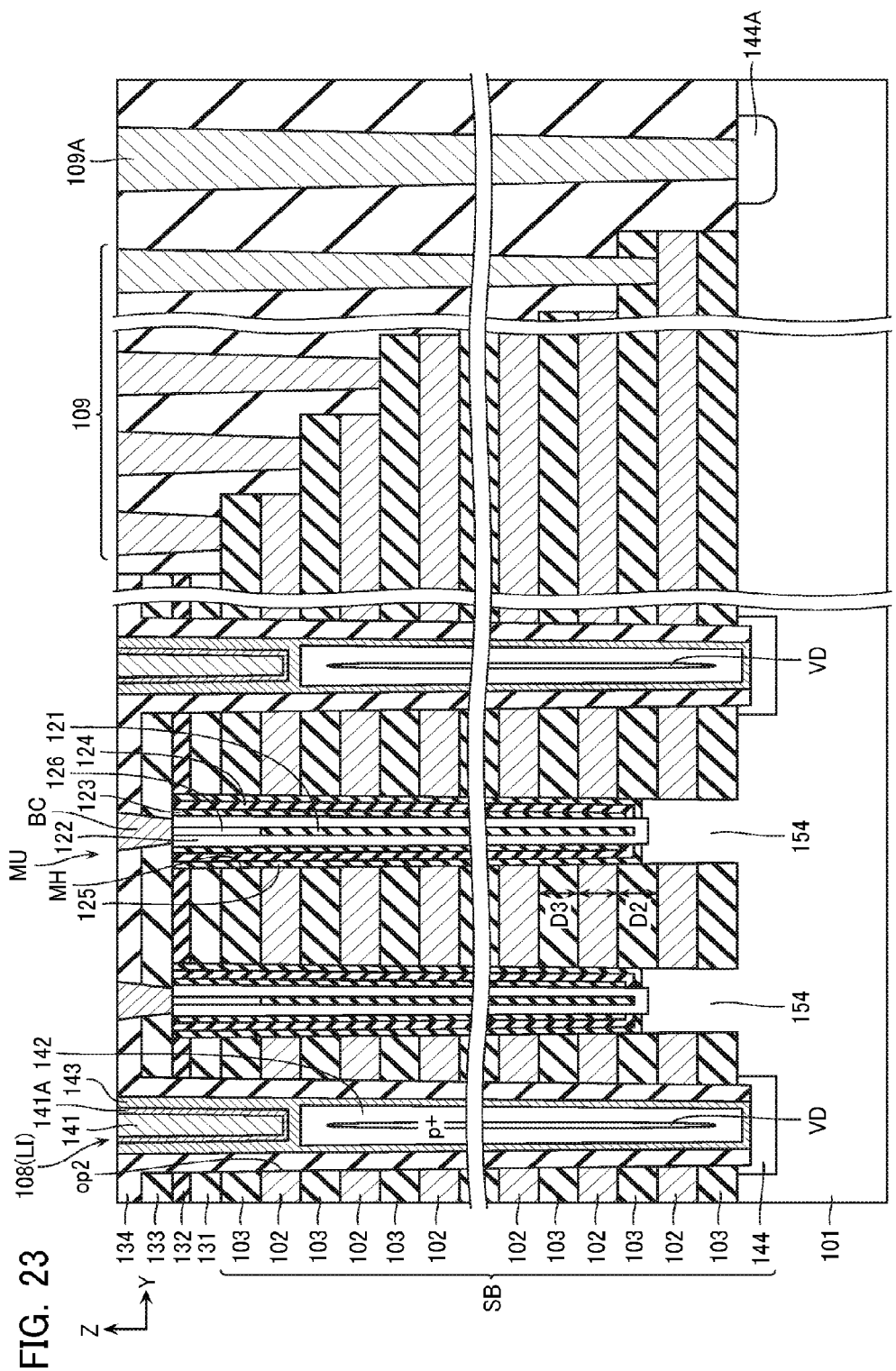
FIG. 23 is a cross-sectional view that shows a part of a configuration of a non-volatile semiconductor memory device according to a fifth embodiment.

Next, with reference to FIG. 23, the following describes a configuration of anon-volatile semiconductor memory device according to a fifth embodiment. The overall configuration of this fifth embodiment is similar to that of the first embodiment (FIG. 1 to FIG. 5). Therefore, the overlapped description will not be further elaborated here. In this fifth embodiment, as shown in FIG. 23, the silicide layer 142 constituting a part of the source contact L1 includes internally a void VD having a longitudinal direction in the Z direction. In this respect, the fifth embodiment differs from the above-described embodiments. Having the void VD in the silicide layer 142 easily silicidize the polysilicon layer 142A to be the silicide layer 142 at the manufacturing process. This ensures the reduction of an electrical resistance of the source contact LI.

[Sixth Embodiment]

Figure 24:
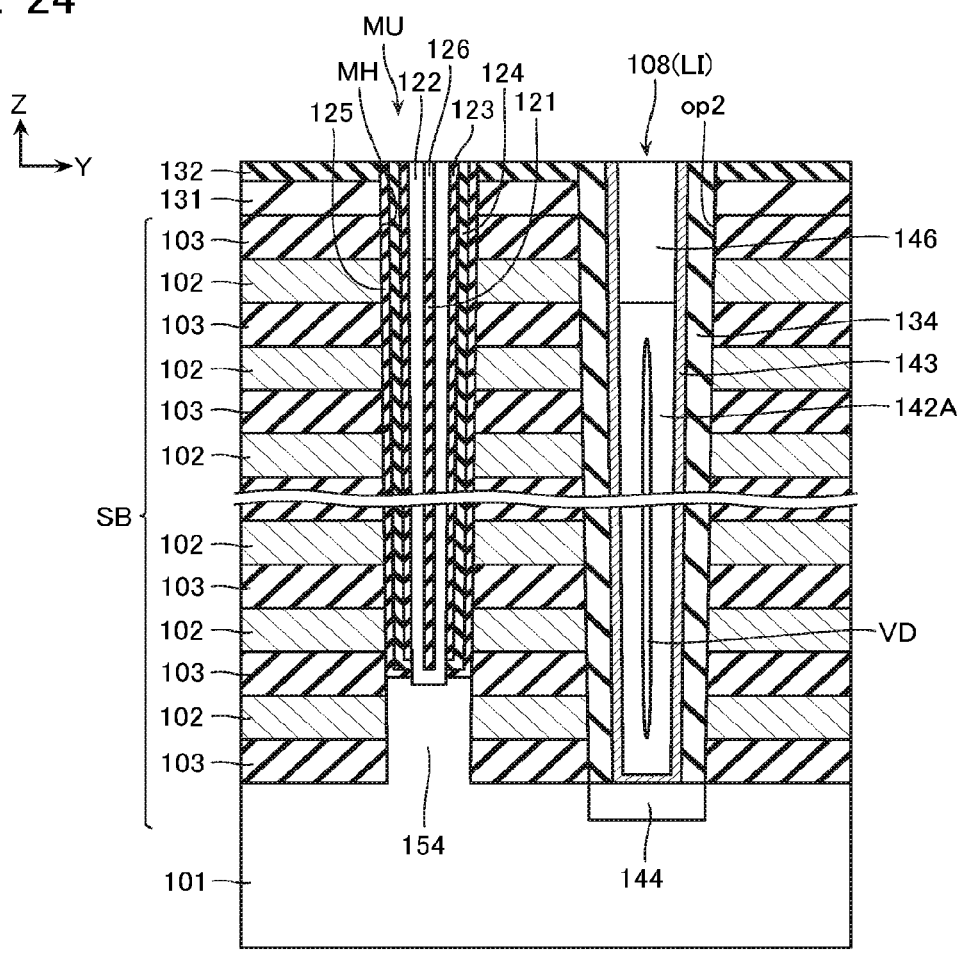
FIG. 24 is a cross-sectional view that shows a part of a configuration of a non-volatile semiconductor memory device according to a sixth embodiment.

Next, with reference to FIG. 24, the following describes a configuration of anon-volatile semiconductor memory device according to a sixth embodiment. The overall configuration of this sixth embodiment is similar to that of the first embodiment (FIG. 1 to FIG. 5). Therefore, the overlapped description will not be further elaborated here. In this sixth embodiment, the structure of the source contact LI differs from the one of the above-described embodiments.

FIG. 24 is a cross-sectional view that shows a cross-sectional configuration of the memory unit MU and the source contact LI of the non-volatile semiconductor memory device according to the sixth embodiment. In FIG. 24, like reference numerals designate identical elements to the elements of FIG. 6. Therefore, the overlapped description will not be further elaborated here.

In the above-described embodiments, the upper portion of the conducting layer 108 constituting the source contact LI is constituted of the metal layer 141 made of metal such as tungsten, and the lower portion of the conducting layer 108 is constituted of the silicide layer 142. In contrast, in this sixth embodiment, the upper portion of the conducting layer 108 is constituted of a silicide layer 146, and the lower portion of the conducting layer 108 is constituted of the polysilicon layer 142A. In this respect, the sixth embodiment differs from the above-described embodiments. The polysilicon layer 142A has a lower end, similar to those of the above-described embodiments, connected to the silicide layer 144 made of dual silicide via the barrier metal 143. As this sixth embodiment, even when the upper portion of the conducting layer 108 is constituted of the silicide layer 146, and the lower portion of the conducting layer 108 is constituted of the polysilicon layer 142A, disposing the silicide layer 144 made of dual silicide at the lower end of the conducting layer 108 can obtain effect identical to the effects of the above-described embodiments.

Figure 25:
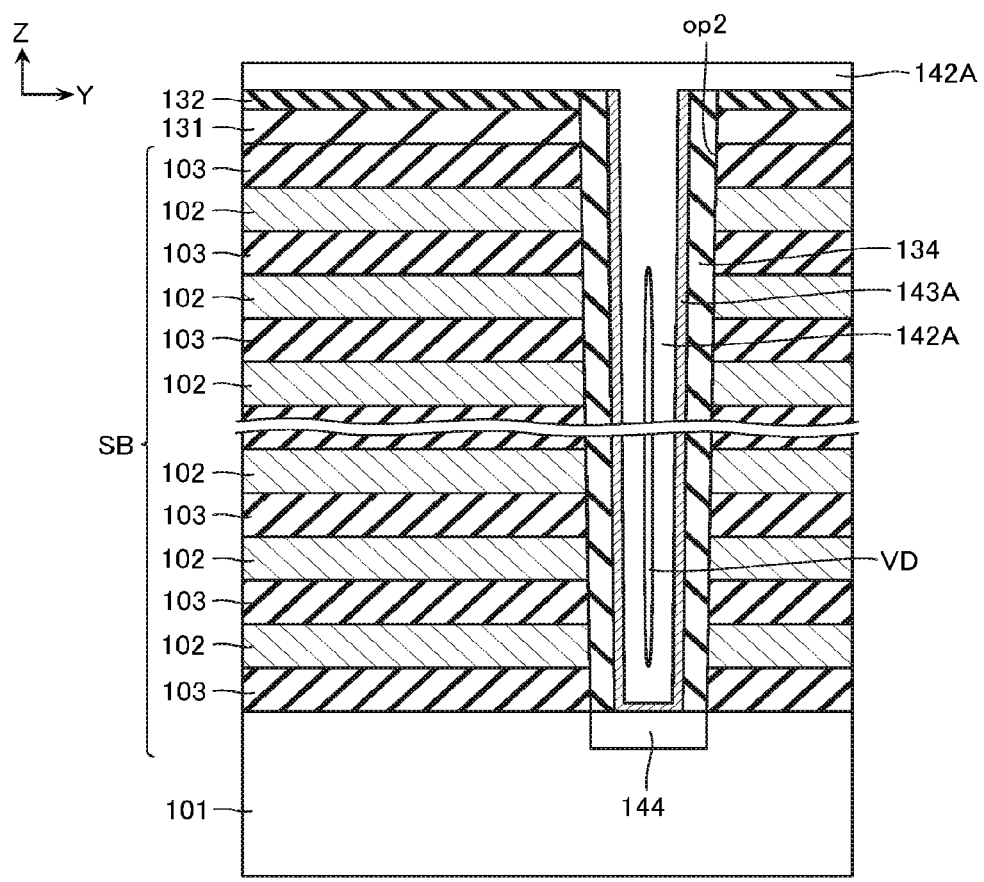
FIG. 25 to FIG. 28 are cross-sectional views that shows manufacturing processes of the non-volatile semiconductor memory device according to the sixth embodiment.
Figure 26:
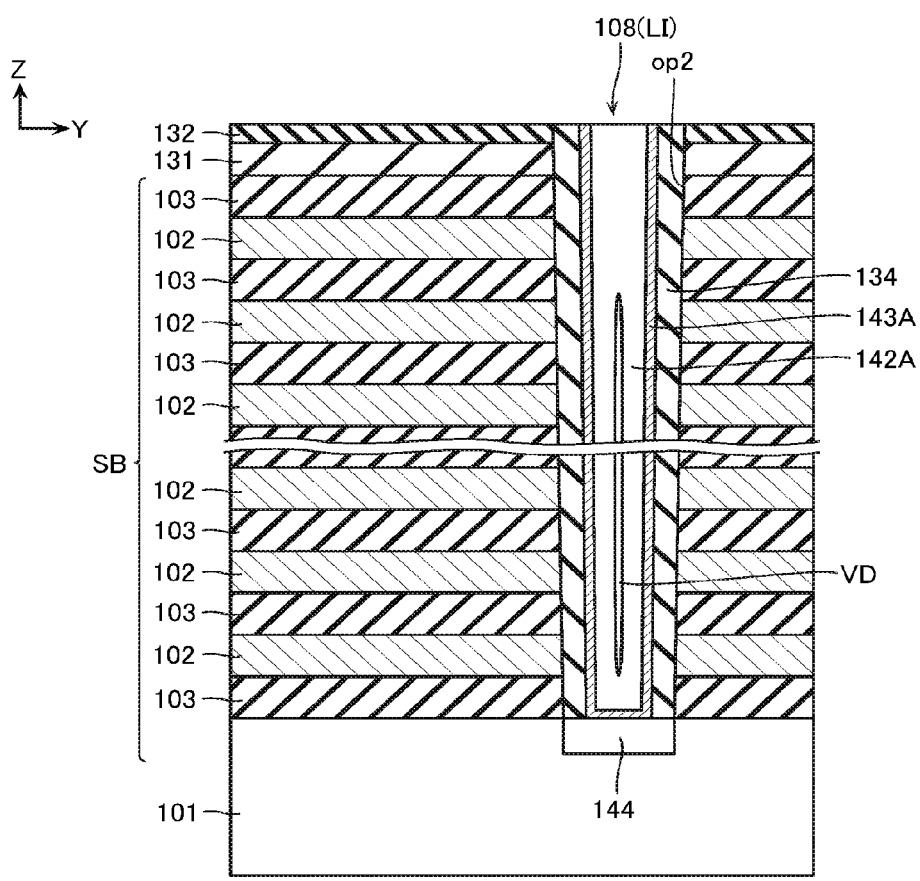

The following describes a manufacturing method for the source contact LI of the non-volatile semiconductor memory device of this sixth embodiment with reference to FIG. 25 to FIG. 28. After performing the processes in FIG. 7 to FIG. 15 approximately similarly to the processes of the first embodiment, the conducting layer 143A and the polysilicon layer 142A are embedded in the opening op2 and on a surface of the laminated body SB as shown in FIG. 25. Thereafter, as shown in FIG. 26, the polysilicon layer 142A deposited on the surface of the laminated body SB is removed by using a CMP method or similar method.

Figure 27:
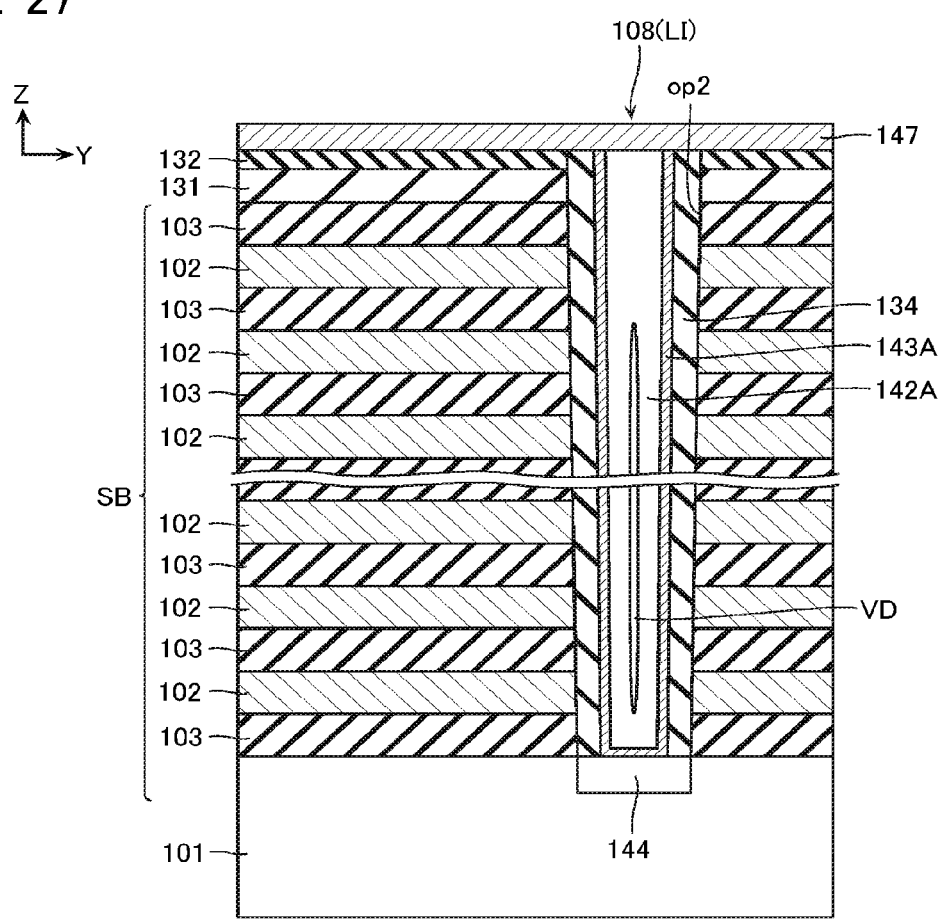
Figure 28:
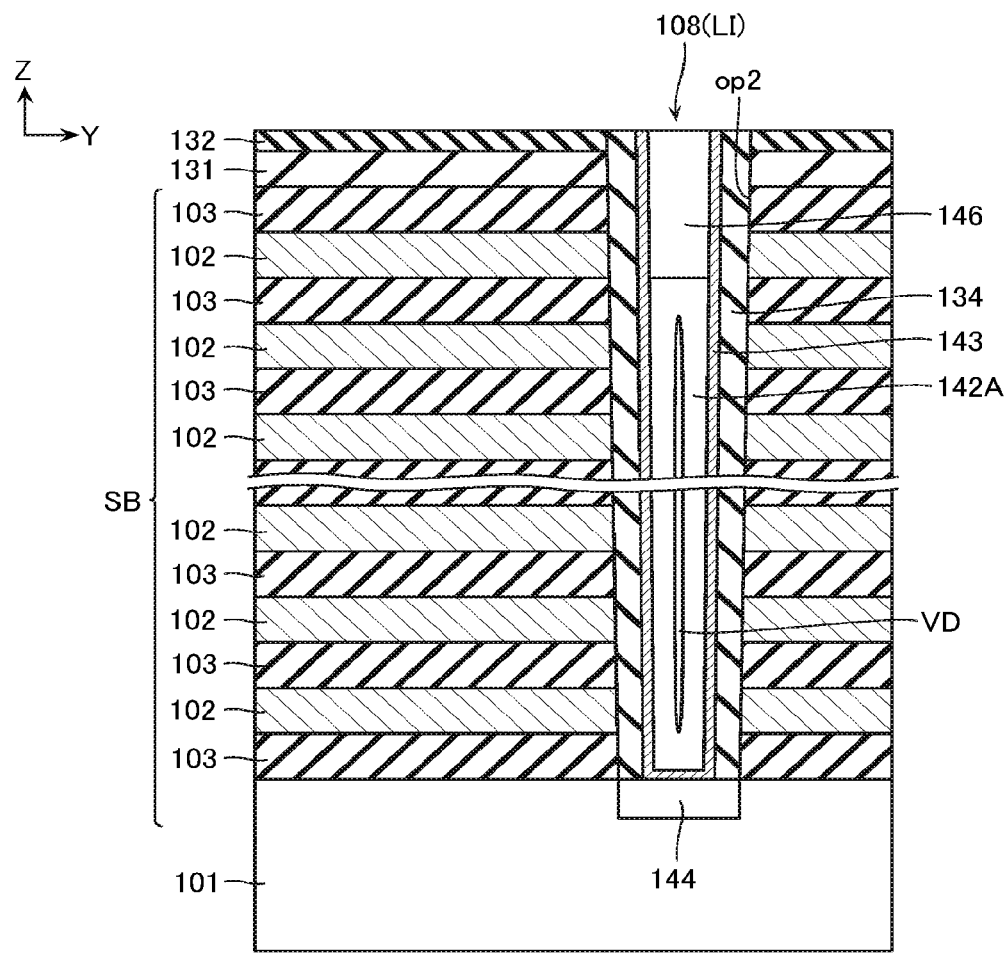

Then, as shown in FIG. 27, a metal film 147 (for example, titanium) for silicidizing is formed on the surface of the laminated body SB so as to contact an upper end of the polysilicon layer 142A by using the PVD method or similar method. Then, the thermal process is performed to silicidize an upper portion of the polysilicon layer 142A to form the silicide layer 146 as shown in FIG. 28. As described above, the source contact LI shown in FIG. 24 is completed.

Figure 29:
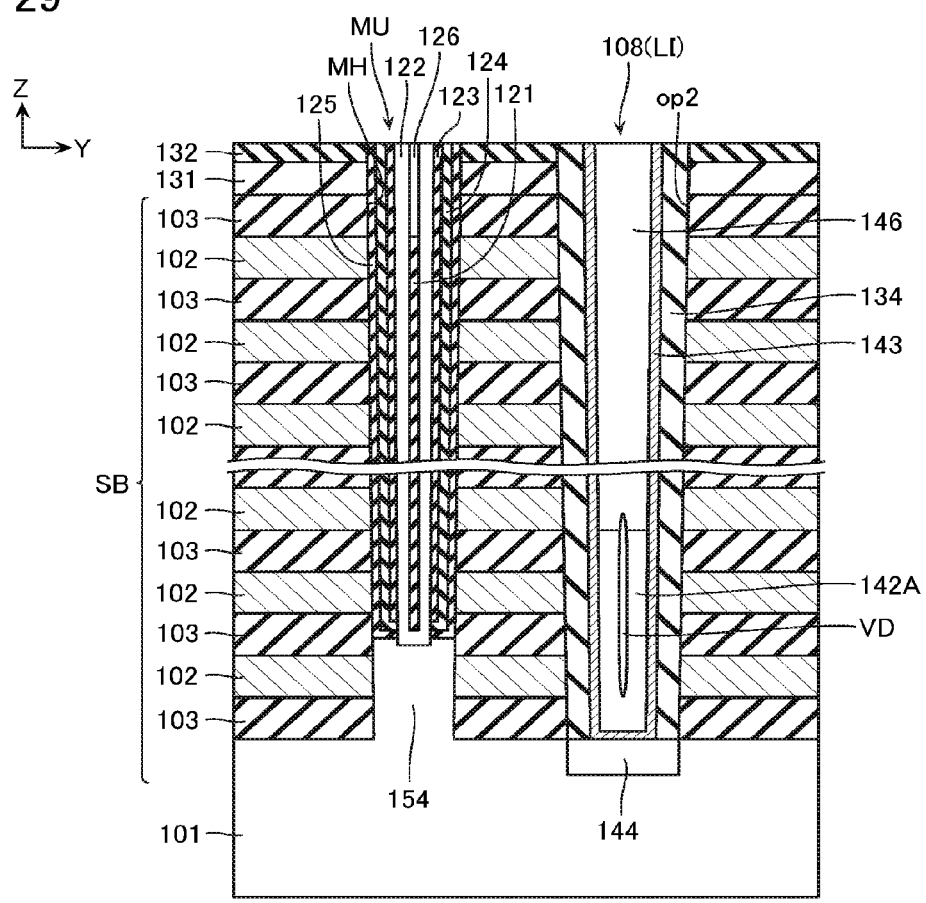
FIG. 29 shows a modification of the sixth embodiment.

In the sixth embodiment, a ratio of length in the Z direction between the polysilicon layer 142A and the silicide layer 146 is not specifically limited to a specific ratio. As in FIG. 29, a configuration where the length in the Z direction of the silicide layer 146 is sufficiently longer than the one of the polysilicon layer 142A can also be employed. At this time, the silicide layer 146 may reach the void VD in the polysilicon layer 142A.

[Seventh Embodiment]

Figure 30:
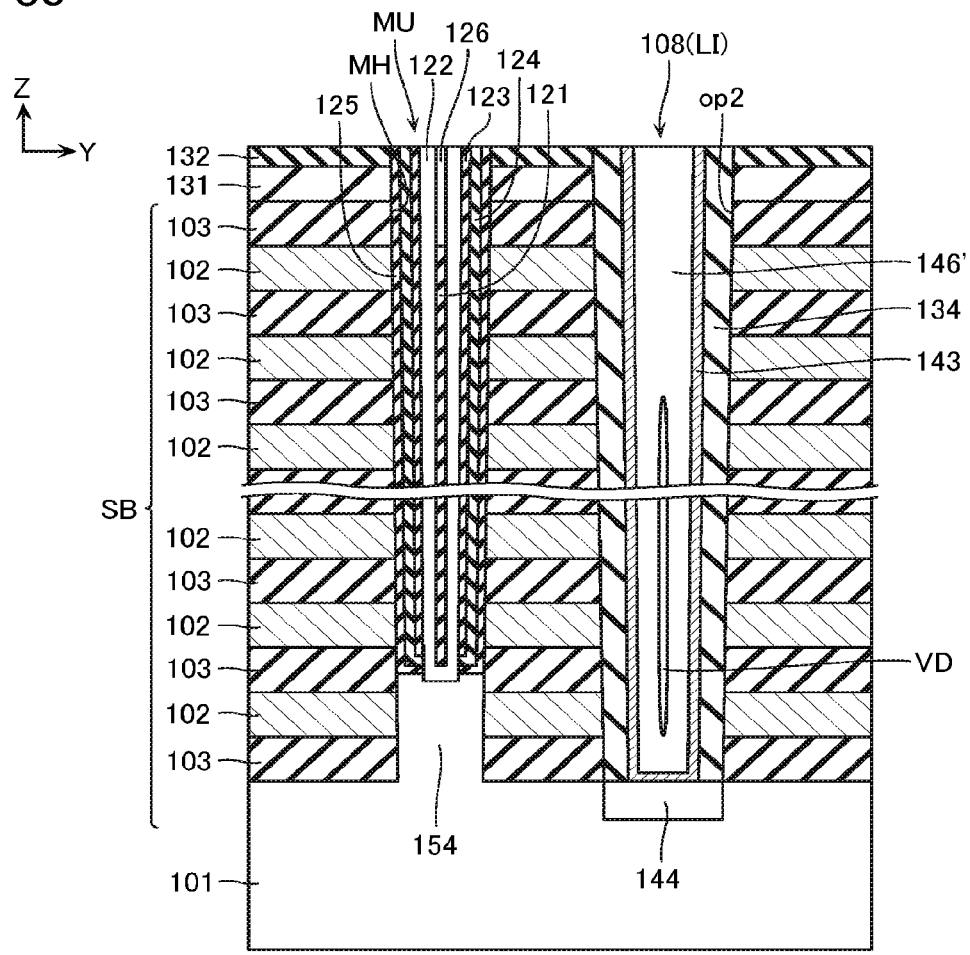
FIG. 30 is a cross-sectional view that shows a part of a configuration of anon-volatile semiconductor memory device according to a seventh embodiment.

Next, with reference to FIG. 30, the following describes a configuration of anon-volatile semiconductor memory device according to a seventh embodiment. The overall configuration of this seventh embodiment is similar to that of the first embodiment (FIG. 1 to FIG. 5). Therefore, the overlapped description will not be further elaborated here. In this seventh embodiment, the structure of the source contact LI differs from those of the above-described embodiments. FIG. 30 is a cross-sectional view that shows a cross-sectional configuration of the memory unit MU and the source contact LI of the non-volatile semiconductor memory device according to the seventh embodiment. In FIG. 30, like reference numerals designate identical elements to the elements of FIG. 6. Therefore, the overlapped description will not be further elaborated here.

In this seventh embodiment, the conducting layer 108 constituting the source contact LI is constituted of a single silicide layer 146'. That is, this silicide layer 146' extends to an inferior surface of the laminated body SB to be connected to the silicide layer 144 as dual silicide via the barrier metal 143. Thus, even when the conducting layer 108 is constituted of only the silicide layer 146', forming the dual silicide layer 144 on the lower end of the conducting layer 108 can obtain effect similar to the effects of the above-described embodiments.

Figure 31:
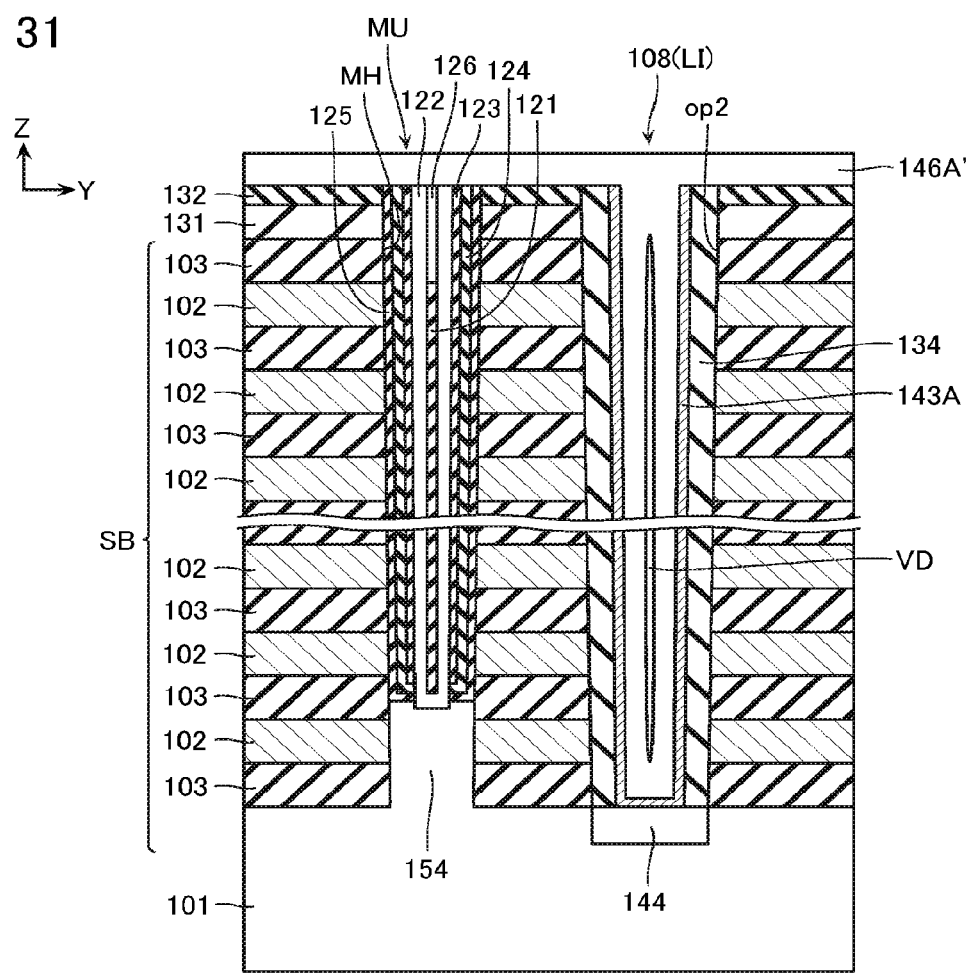
FIG. 31 to FIG. 34 are cross-sectional views describing a manufacturing method of the non-volatile semiconductor memory device of this seventh embodiment.

The following describes a manufacturing method for the source contact LI of the non-volatile semiconductor memory device of this seventh embodiment with reference to FIG. 31 to FIG. 34. After performing the processes in FIG. 7 to FIG. approximately similar to the processes of the first embodiment, the conducting layer 143A and a polysilicon layer 146A' are embedded in the opening op2 and on the surface of the laminated body SB as shown in FIG. 31. The polysilicon layer 146A' is embedded to the extent that the void VD extending in the Z direction is formed in the polysilicon layer 146A'.

Figure 32:
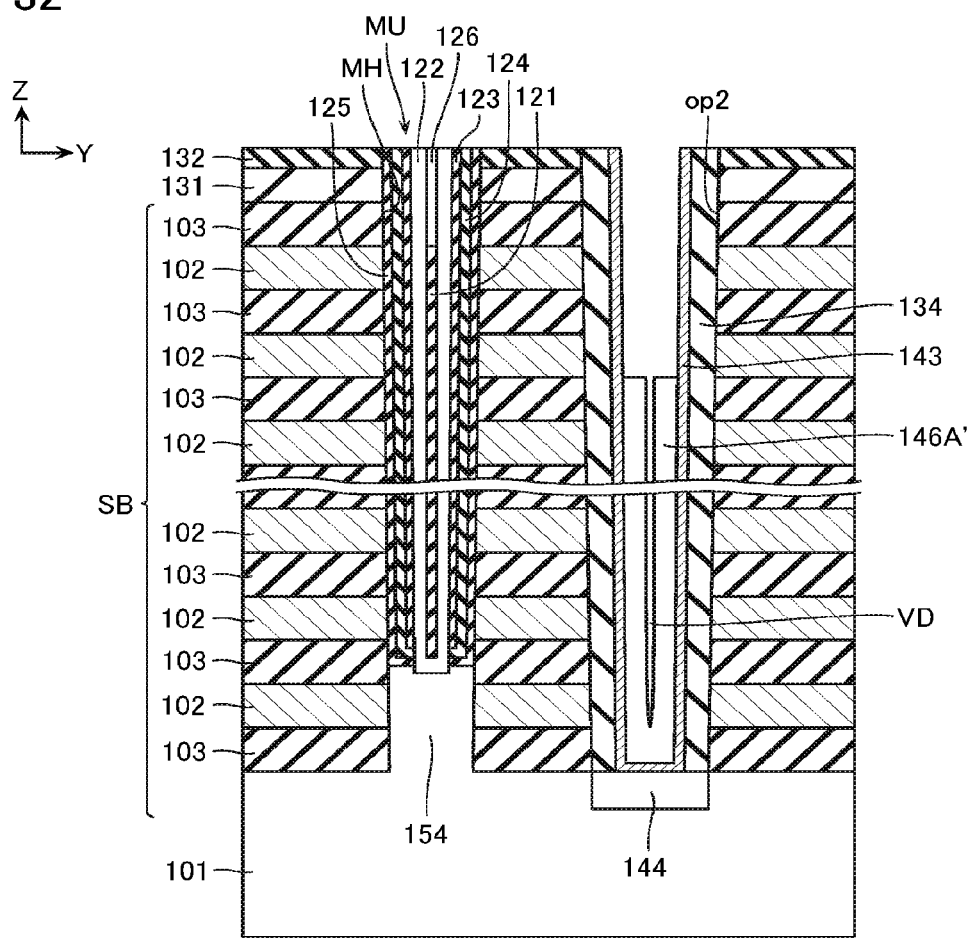

Thereafter, as shown in FIG. 32, the polysilicon layer 146A' deposited on the surface of the laminated body SB outside the opening op2 is removed by using the CMP method or similar method, and the polysilicon layer 146A' in the opening op2 is also etched back to a predetermined height to open an upper end of the void VD formed on the polysilicon layer 146A'.

Figure 33:
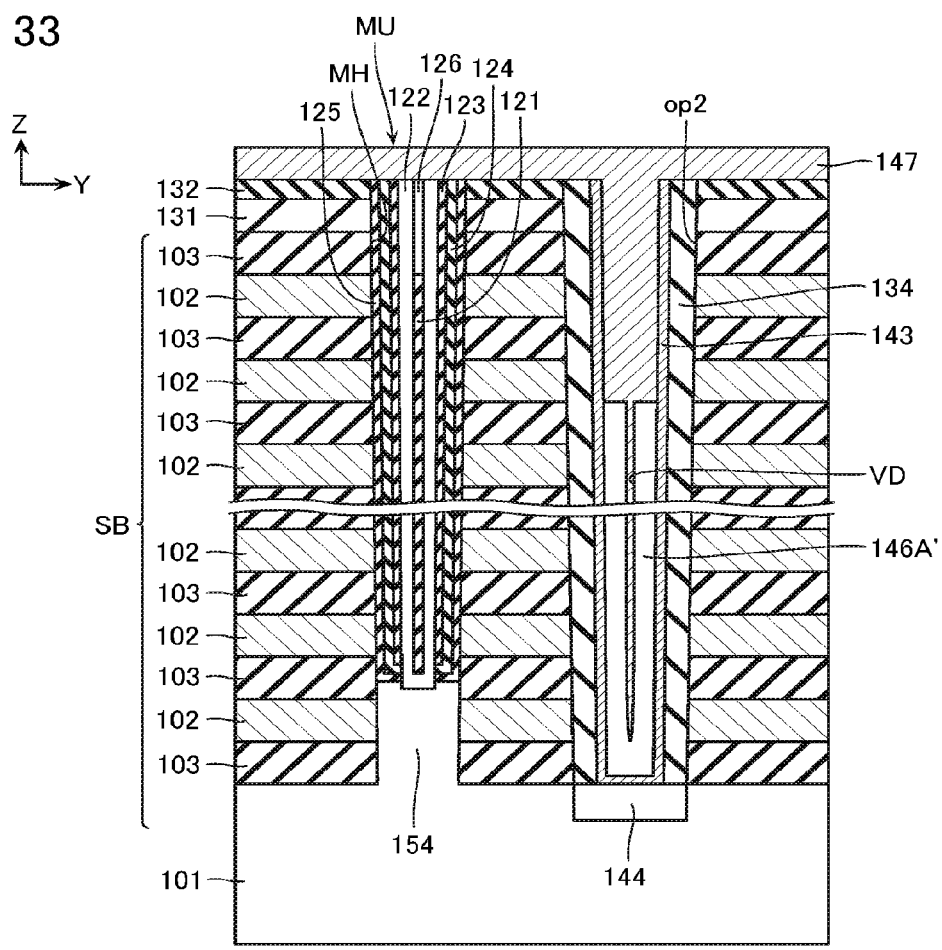

Then, as shown in FIG. 33, the metal film 147 (for example, titanium) for silicidizing is formed so as to fill the surface of the laminated body SB and the inside of the opening op2 by using the PVD method or similar method. The metal film 147 is also embedded in the void VD opened at the process in FIG. 32.

Figure 34:
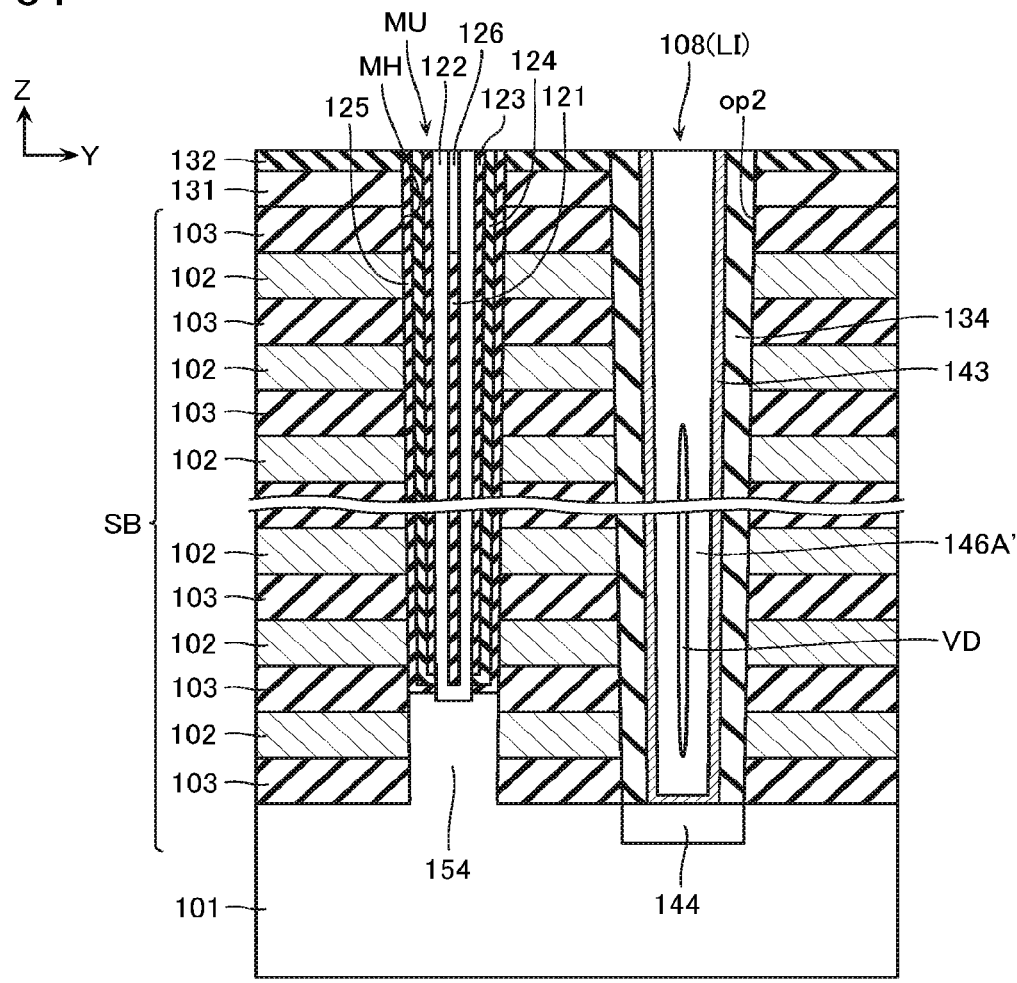

Then, the thermal process is performed to silicidize the polysilicon layer 146A' to form the silicide layer 146 as shown in FIG. 34. Since the metal film 147 is also embedded in the void VD, the polysilicon layer 146A' is silicidized to its lower end. As described above, the source contact LI shown in FIG. 30 is completed.

[Eighth Embodiment]

Figure 35:
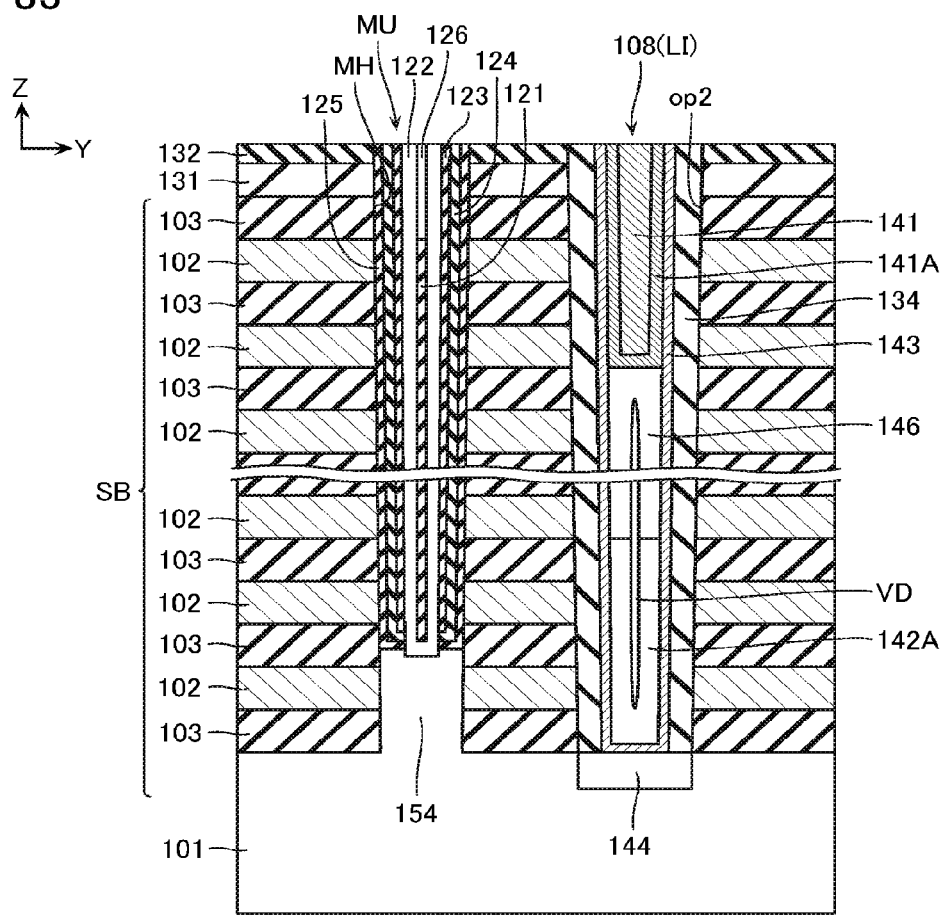
FIG. 35 is a cross-sectional view that shows a part of a configuration of anon-volatile semiconductor memory device according to an eighth embodiment.

Next, with reference to FIG. 35, the following describes a configuration of anon-volatile semiconductor memory device according to an eighth embodiment. The overall configuration of this eighth embodiment is similar to that of the first embodiment (FIG. 1 to FIG. 5). Therefore, the overlapped description will not be further elaborated here. In this eighth embodiment, the structure of the source contact LI differs from those of the above-described embodiments. FIG. 35 is a cross-sectional view that shows across-sectional configuration of the memory unit MU and the source contact LI of the non-volatile semiconductor memory device according to the eighth embodiment. In FIG. 35, like reference numerals designate identical elements to the elements of FIG. 6. Therefore, the overlapped description will not be further elaborated here. At the non-volatile semiconductor memory device of this eighth embodiment, as shown in FIG. 35, the conducting layer 108 constituting the source contact LI has an upward part constituted of the metal layer 141 and the barrier metal 141A, similar to the one of the first embodiment. However, the conducting layer 108 has an intermediate part and a lower part constituted of the silicide layer 146 and the polysilicon layer 142A, respectively. That is, the conducting layer 108 of this eighth embodiment is approximately constituted of the metal layer 141, the silicide layer 146, and the polysilicon layer 142A from above. Even at such configuration, disposing the silicide layer 144 made of dual silicide at the lower end of the conducting layer 108 can obtain effect similar to the effects of the above-described embodiments.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of control gate electrodes laminated on a substrate;
   a first semiconductor layer that has one end connected to the substrate, has a longitudinal direction in a direction intersecting with the substrate, and is opposed to the plurality of control gate electrodes;
   an electric charge accumulating layer positioned between the first semiconductor layer and one of the plurality of control gate electrodes;
   a first contact that has one end connected to the substrate and another end connected to a source line; and
   a second contact that has one end connected to the substrate and another end connected to a wiring other than the source line, wherein:
   the first contact includes a first silicide layer arranged on the substrate,
   the second contact includes a second silicide layer arranged on the substrate,
   the first silicide layer has a higher temperature resistance than the second silicide layer,
   the first contact further includes:
   a third silicide layer that has a lower end connected to a top surface of the first silicide layer; and
   a metal layer connected to an upper end of the third silicide layer; and
   the semiconductor memory device further comprises a barrier metal layer arranged between the third silicide layer and the metal layer.

2. The semiconductor memory device according to claim 1, wherein:
   the first silicide layer includes a first metal atom,
   the second silicide layer includes a second metal atom, and
   the first metal atom has an atomic radius greater than an atomic radius of the second metal atom.

3. The semiconductor memory device according to claim 2, wherein
   the first metal atom is platinum (Pt), tantalum (Ta), tungsten (W), or hafnium (Hf).

4. The semiconductor memory device according to claim 2, wherein
   the first silicide layer is a dual silicide of a silicide of the first metal atom and a silicide of a third metal atom, and an atomic radius of the third metal atom is smaller than the atomic radius of the first metal atom.

5. The semiconductor memory device according to claim 1, further comprising
   a barrier metal layer arranged between the first silicide layer and the third silicide layer.

6. A semiconductor memory device comprising:
   a plurality of control gate electrodes laminated on a substrate;
   a first semiconductor layer that has one end connected to the substrate, has a longitudinal direction in a direction intersecting with the substrate, and is opposed to the plurality of control gate electrodes;
   an electric charge accumulating layer positioned between the first semiconductor layer and one of the plurality of control gate electrodes; and
   a contact that has one end connected to the substrate and another end connected to a source line, wherein:
   the contact includes a first silicide layer arranged on the substrate,
   the first silicide layer includes a first metal atom, an atomic radius of the first metal atom being larger than an atomic radius of nickel,
   the contact further includes:
   a second silicide layer that has a lower end connected to a top surface of the first silicide layer; and
   a metal layer connected to an upper end of the second silicide layer; and
   the semiconductor memory device further comprises a barrier metal layer arranged between the second silicide layer and the metal layer.

7. The semiconductor memory device according to claim 6, wherein
   the first metal atom is platinum (Pt), tantalum (Ta), tungsten (W), or hafnium (Hf).

8. The semiconductor memory device according to claim 6, wherein
   the first silicide layer is a dual silicide of a silicide the first metal atom and a silicide of a second metal atom, and an atomic radius of the second metal atom is smaller than the atomic radius of the first metal atom.

9. The semiconductor memory device according to claim 6, further comprising a barrier metal layer arranged between the first silicide layer and the second silicide layer.

* * * * *